(12) United States Patent
McCarthy et al.

(10) Patent No.: US 6,783,841 B2
(45) Date of Patent: *Aug. 31, 2004

(54) LOW SIGNAL LOSS BONDING PLY FOR MULTILAYER CIRCUIT BOARDS

(75) Inventors: Thomas F. McCarthy, Bennington, VT (US); David L. Wynants, Sr., Cambridge, NY (US)

(73) Assignee: Tonoga, Inc., Petersburgh, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/448,081

(22) Filed: May 29, 2003

(65) Prior Publication Data

US 2003/0203174 A1 Oct. 30, 2003

Related U.S. Application Data

(60) Continuation-in-part of application No. 10/289,984, filed on Nov. 7, 2002, which is a division of application No. 09/952,486, filed on Sep. 14, 2001, now Pat. No. 6,500,529.

(51) Int. Cl.[7] .................................................. B32B 3/00
(52) U.S. Cl. .................... 428/209; 428/297.4; 428/323; 428/344; 174/258; 174/259; 427/121
(58) Field of Search .......................... 428/209; 174/258, 174/259

(56) References Cited

U.S. PATENT DOCUMENTS

| | | |
|---|---|---|
| 2,932,599 A | 4/1960 | Dahlgren |
| 2,955,974 A | 10/1960 | Allen et al. |
| 3,606,677 A | 9/1971 | Ryan |
| 3,649,475 A | 3/1972 | Degnan et al. |
| 4,403,653 A | 9/1983 | Davidson |
| 4,680,220 A | 7/1987 | Johnson |
| 4,784,901 A | 11/1988 | Hatakeyama et al. |
| 4,849,284 A | 7/1989 | Arthur et al. |

(List continued on next page.)

FOREIGN PATENT DOCUMENTS

| | | |
|---|---|---|
| EP | 0 334 499 | 9/1989 |
| EP | 1 117 281 | 7/2001 |
| GB | 2 109 166 A | 5/1993 |
| JP | 60-235844 | 11/1985 |
| JP | 63-081139 | 4/1988 |
| JP | 02-245330 | 10/1990 |
| JP | 03-110158 | 5/1991 |
| JP | 6-322157 | 11/1994 |
| JP | 11-112147 | 4/1999 |

OTHER PUBLICATIONS

Frankosky, J., *Processing PTFE/Clad PCBS*, Printed Circuit Fabrication, vol. 15, No. 11, Nov. 1992, pp. 22, 25.

Primary Examiner—Cathy Lam
(74) Attorney, Agent, or Firm—Heslin Rothenberg Farley & Mesiti P.C.; Mary Louise Gioeni, Esq.

(57) ABSTRACT

A process for fabricating a low loss multilayer printed circuit board using a bonding ply comprising a reinforced fluoropolymer composite and a high-flowing thermosetting adhesive composition is disclosed. The fluoropolymer composite comprises at least one fluoropolymer and a substrate selected from woven fabrics, nonwoven fabrics and polymeric films.

30 Claims, 13 Drawing Sheets

U.S. PATENT DOCUMENTS

| | | |
|---|---|---|
| 4,886,699 A | 12/1989 | Carroll et al. |
| 4,902,556 A | 2/1990 | Benedikt et al. |
| 5,001,010 A | 3/1991 | Chao et al. |
| 5,043,367 A | 8/1991 | Hallgren et al. |
| 5,108,842 A | 4/1992 | Hallgren et al. |
| 5,141,791 A | 8/1992 | Chao et al. |
| 5,162,450 A | 11/1992 | Chao et al. |
| 5,213,886 A | 5/1993 | Chao et al. |
| 5,214,571 A | 5/1993 | Dahlgren et al. |
| 5,218,030 A | 6/1993 | Katayose et al. |
| 5,250,347 A | 10/1993 | Mehta et al. |
| 5,352,745 A | 10/1994 | Katayose et al. |
| 5,538,756 A | 7/1996 | Korleski et al. |
| 5,571,609 A | 11/1996 | St. Lawrence et al. |
| 5,635,293 A | 6/1997 | Korleski et al. |
| 5,652,055 A | 7/1997 | King et al. |
| 5,929,518 A | 7/1999 | Schlaiss |
| 6,066,386 A | 5/2000 | Boyko et al. |
| 6,254,972 B1 | 7/2001 | Farquhar et al. |
| 6,388,204 B1 | 5/2002 | Lauffer et al. |
| 6,500,529 B1 * | 12/2002 | McCarthy et al. .......... 428/209 |

* cited by examiner

LOW SIGNAL LOSS BONDING PLY FOR MULTILAYER CIRCUIT BOARDS

CROSS REFERENCE TO RELATED APPLICATIONS

This application is a continuation-in-part of copending U.S. application, Ser. No. 10/289,984, filed Nov. 7, 2002, which is a division of U.S. application Ser. No. 09/952,486, filed on Sep. 14, 2001, now issued as U.S. Pat. No. 6,500,529, the priorities of which are claimed herein to the extent allowed. The entire disclosures of both applications are incorporated herein by reference.

FIELD OF THE INVENTION

This invention relates to a multilayer bonding prepreg comprising a fluoropolymer, a reinforcement typically consisting of fiberglass to reinforce the low signal loss fluoropolymer, a surface coated thermosetting resin and a ceramic dielectric modifier to control the coefficient of thermal expansion and reduce the resulting dissipation factor. This invention further relates to a bonding ply composition that has the ability to reform during lamination such that the PTFE-fiberglass layer has the ability to conform to the outline of copper circuitry, thus reducing the mass of thermosetting material required to fill circuitry. It has been unexpectedly found that one can influence the ability of the PTFE-fiberglass layer to conform around copper circuitry by designing a thermosetting adhesive composition of very low viscosity. Ceramic is used in either the fluoropolymer coated glass component, the thermosetting resin surface component, or in both components. The composite is used as a low signal loss bonding ply, Df<0.005, Dk<4.0, that can be pressed at low temperatures to manufacture a multilayer circuit board for high frequency applications. The invention also relates to a copper clad laminate that may comprise the following, a low loss prepreg (fluoropolymer-reinforcement-thermosetting resin), another low loss substrate (fluoropolymer-reinforcement), a reinforcement layer that may or may not contain a thermosetting resin, a film that may or may not contain fluorine.

BACKGROUND OF THE INVENTION

In the electronics industry multilayer circuit boards are prepared by bonding a layer of incompletely cured thermosetting resin reinforced with fiberglass between layers of a fully cured print and etched laminate. For a multilayer epoxy based circuit board, first an epoxy coated fiberglass composite is laminated with thin copper foil on both sides. The copper is patterned using conventional printed circuit board manufacturing processes. This layer is referred to as the inner layer. These innerlayer print and etched copper laminates are then bonded together typically using an FR-4 prepreg (a flame retarded partially cured sheet of epoxy coated fiberglass that has no copper foil cladding) using the partially cured epoxy as an adhesive layer by pressing the construction together in a press at temperatures such as 360° F. (182° C.) for two hours at 200 psi, thereby fully curing the epoxy FR-4 adhesive layer. A composite is thereby created having non-pattered copper layers at the surfaces and patterned inner layers being separated by the adhesive layer. The top and bottom non-patterned copper layers (the outer layers) can then be print and etched yielding a multilayer circuit board.

One drawback of using many conventional thermosetting resins as the adhesive layer is the poor electrical properties of the bonding adhesive layer. Epoxy based thermosetting resin, for example, has poor electrical loss characteristics in the 1–100 gigahertz range. For very long trace lengths, signal degradation forces the use of lower loss dielectrics. This is increasingly becoming the case for high speed digital applications (routers, backplanes, motherboards and daughter boards). For the RF and mm wave frequencies, polytetrafluoroethylene (PTFE) based materials are traditionally used to prevent signal loss. PTFE based materials have been available for a long time for the most demanding low signal loss applications but have been avoided for cost considerations. Conventional thermosetting resins have too high a loss tangent at the high frequencies and are nearing their ultimate limits at 2.5 GHz. As frequencies extend to the 5 and 10 GHz range, it is likely that epoxy resins will be replaced by higher performing materials. In the last 10 years epoxies were acceptable up to 2–3 GHz but seem to be being designed out as designs move to 5 GHz. Suppliers of epoxy laminate have been reducing the loss tangent of their products by switching to lower loss polyphenylene oxide based polymers and ceramic fillers. Typical fiberglass based PTFE products have 0.001–0.004 loss tangents, depending on fiberglass wt %, versus 0.007–0.014 for modified epoxies and related materials (10 GHz). As signal integrity drives the use of higher performing materials, epoxy based solutions will eventually fall short even with high loadings of ceramics or the addition of lower loss modifying resins.

The dielectric constant is less critical but it is desired to be below 4.0. At the high frequencies the market is largely driven by dissipation factor and the dielectric constant is taken for granted. Backpanels and daughter cards have been growing in the number of layers due to the need to eliminate crosstalk between circuitry. Lower dielectric constants lead to thinner dielectric spacings. By designing using lower and lower dielectric constant, the engineer can increase the number of layers yet not increase the total overall pwb thickness if the dielectric thickness of the individual layers can be reduced by using lower dielectric constant materials.

An alternative solution is the use of expanded PTFE that has been filled with epoxy and ceramic, thereby diluting the concentration of the higher loss epoxy component. This combination of epoxy, ceramic, and PTFE results in a sufficiently low loss product to be acceptable for high speed digital applications. The downside is that the expanded PTFE based solution is quite expensive and there are issues of dimensional movement that becomes significant with increasing layer count. U.S. Pat. Nos. 4,985,296; 4,996,097; 5,538,756; and 5,512,360 awarded to W. L. Gore describe the use of a thermosetting resin impregnated into an expanded PTFE web. These patents teach the use of incorporating ceramic in the PTFE expanded web manufacture and/or part of the non-fluorinated adhesive resin system to obtain low loss materials.

Ceramic filled resin systems based on polybutadiene-woven fiberglass based prepregs, both filled and unfilled with flame retardant additives, are known to be relatively low loss materials (U.S. Pat. No. 5,571,609). These materials suffer from the inconsistent quality of the peroxy cured rubber system and the poor bond strengths of the cured rubber to copper foil. A related material, crosslinked polyesters filled with kaolin, has attractive dielectric properties but unattractive peel strengths and other fabrication problems.

Polyphenylene oxide (PPO, APPE, PPE) based resin systems that are cured systems of low molecular weight PPO and epoxy resins have some process limitations (U.S. Pat. No. 5,043,367; 5,001,010; 5,162,450) for high-speed digital or high frequency applications. Their loss tangents in the gigahertz frequency range are reported to be in the 0.006–0.008 range. This is an improvement over standard epoxy but their lack of flow has led to their withdrawal from the marketplace.

Very low loss solutions include PTFE based materials and optical interconnects. Solutions containing pure PTFE based adhesive layers have the disadvantage that these materials need to be processed at temperatures exceeding 700° F. (fusion bonding, 371° C.). There are fabricators today building multilayer structures based on fluorinated resin systems. Most fabricators do not have equipment capable of pressing at these temperatures, nor are the extended heating and cooling attractive to fabricators. High temperature pressing on a 34-layer count stack up could result in decreased reliability of plated through holes, PCB warping, and copper pad distortion. In high speed digital applications, via holes and stubs are a real source of signal loss. The number one obstacle for high speed digital applications is the high layer count stack-up that encourages OEMs to source board materials that are process friendly. For high speed digital applications, the high frequency materials may be separated from the standard FR-4 lower frequency layers. This may lead to multiple lamination cycles. Fabricators prefer to press laminates relatively quickly at conventional epoxy pressing temperatures below 350° F. (177° C.) and have scaled their pressing capacity so that it is not a bottleneck in the entire printed circuit board fabrication process. Thus FR-4 is a material of choice. However, increasing operating frequencies demand materials having lower loss characteristics. Therefore, a composite that enables multilayer lamination at epoxy processing temperatures that has a minimum component of a hydrocarbon resin is especially desirable.

One approach is to combine a PTFE-fiberglass composite with a traditional FR-4 epoxy impregnated fiberglass within a laminate or between two layers of copper. This has been described in WO0011747. The advantage of this approach is that it is not necessary to treat the surface of the PTFE-fiberglass with a layer of thermosetting adhesive. The disadvantage of this approach is that the thermosetting resin is combined with a fairly lossy fiberglass reinforcement. Because adhesion to the copper is required at the processing temperatures of conventional thermosetting resins, an FR-4 layer would be required between the copper layer and the PTFE-fiberglass layer. The simplest embodiment would comprise a copper layer, FR-4 layer for bonding, PTFE-fiberglass, FR-4 layer, copper. This approach would be somewhat challenged to obtain a thin core laminate reaching very low dissipation factors and 3–5 mil dielectric spacings.

Disclosed in this invention is a fluoropolymer coated fiberglass composite that is used as the component to deliver low signal loss properties. The fluoropolymer coated fiberglass composite is then surface treated to enable it to bond to other surfaces. Surface treatment is conducted on the nanometer scale in order to maintain the desirable bulk properties of the fluoropolymer. The surfaces of the chemically modified sheet of fluoropolymer-coated glass are then coated with a thin layer of a thermosetting resin which may or may not contain a ceramic dielectric modifier or other filler (refer to FIG. 1). Although the thermosetting resin may represent a compromise to the otherwise good electric properties of the PTFE coated fiberglass, the thermoset enables the manufacture of a multilayer laminate at conventional epoxy processing temperatures. The thermosetting resin is cured to a minimum extent possible (B-staged) during the coating of the thermoset onto a fluoropolymer composite comprising a substrate selected from woven fabric, non-woven or a polymeric film. It is preferred that the thermosetting layer is dried onto the low loss substrate with the ideal condition being no degree of cure. This is limited in a real life manufacturing sense because the solvent must be driven from the prepreg in an economically viable fashion that requires forced hot air to drive the solvent off to a lower limit that is acceptable by IPC standards. The electrical properties of the resulting prepreg are then determined by the ratio of the coated thermosetting resin to the fluoropolymer-coated fiberglass starting material. It is preferred to limit the amount of thermosetting resin to just enough to fill the spaces between the copper traces of the inner layers and still obtain a good bond. When the low loss substrate comprises PTFE, fiberglass, and/or a ceramic additive, no flame retardant is required ensuring a low dissipation factor at high frequencies.

One significant challenge is to obtain a low dielectric constant, low dissipation factor, low cost, and good thermal reliability. Japanese unexamined patent application 60-235844 teaches a composition comprising a PTFE woven glass substrate. However, no regard for the dissipation factor of the composition is given. 10 years ago most thermosetting resins would satisfy the dissipation factor for the low frequencies in use. Combining a PTFE-fiberglass substrate with a thermosetting resin requires a special attention to the gap filling ability of the prepreg to fill gaps between print and etched circuitry, the flow rheology of the thermoset to fill those spaces, the loss factor (Df) desired by the designers, and therefore the balance between the ratio of the PTFE-fiberglass layer, the low loss substrate layer, to the thermosetting layer. A given amount of thermosetting resin is necessary to fill one and 2 oz circuitry. At least a mil of thermosetting resin is necessary to fill 1 oz circuitry and about 2.0 mil is necessary to fill 2 oz circuitry. For a composition where a thermosetting resin is deposited onto the two faces of a low loss substrate that has no porosity, only thermosetting resin that is deposited on one face of the substrate is capable of filling gaps in copper circuitry on that respective side. In other words, it cannot be anticipated that thermosetting resin would flow through a non porous low loss substrate to fill gaps in copper circuitry on the opposite side of the low loss substrate. Because a flame retardant thermosetting layer can be anticipated to be the highest loss component, the careful choice of a low dielectric constant ceramic modifier will help reduce the dissipation factor.

High speed digital applications demand thin substrates with dielectric constants less than 4.0, dissipation factors closing in on 0.005, dielectric spacings of 3 to 4 mil, and thermally reliable substrates. FR-4, for example has a dissipation factor of 0.018 at 10 GHz. A construction of 1 mil of FR-4, for example, disposed on each side of a chemically modified 2 mil PTFE-fiberglass substrate, would be expected to have a dissipation factor in excess of 0.01. For such a composition to reach a dissipation factor of 0.005 or less, the chemical structure of the thermosetting layer must be carefully chosen, and the balance between the very low loss PTFE-fiberglass layer and the higher loss thermosetting layer, must be carefully controlled. Prior art must be carefully evaluated as to whether it meets the requirements of a dissipation factor less than or about 0.005, and prescribe what is required. For a given PTFE-fiberglass laminate, the dissipation factor of the laminate will be dependent on the concentration of the high loss fiberglass. However, if the PTFE concentration is kept constant and the high loss fiberglass is replaced with a low loss ceramic material of suitable dielectric constant, a reduction in dissipation factor can be achieved. WO0011747 and other prior art do not suggest that the dissipation factor of the composition can be reduced by incorporating low loss, low dielectric constant ceramic additives to the thermosetting layer. It also does not suggest a process of combining a low loss substrate (PTFE-fiberglass) or plurality of such prepregs with a prepreg comprising a fluoropolymer, a reinforcement, and a thermosetting resin, or plurality of such prepregs to obtain a prepreg layer or a copper clad laminate. By alternating layers of prepregs comprising a thermosetting resin and layers of prepreg comprising only reinforced fluoropolymer (PTFE-fiberglass), lower cost can be obtained in addition to a reduced dissipation factor.

Unexamined Japanese Patent Application 6-322157 suggests the use of filler materials to achieve a high dielectric constant composite comprising a narrowly defined epoxy resin, a reinforcement, and high dielectric constant fillers. 100 to 600 phr of high dielectric ceramic powder combined with 100 phr of a polysulfone is used to impregnate a reinforcement. Dielectric constants>7.4 are taught. This prior art does anticipate the addition of high dielectric constant ceramics to a layer of epoxy resin but does not disclose a solution for a low loss laminate or prepreg, the lowest dissipation factor cited for the compositions cited as 0.011.

The present invention anticipates a composition comprising a fluoropolymer, a reinforcement, and a thermosetting layer that is capable of producing a laminate with a dissipation factor less than 0.005 and a dielectric constant less than 4.0. It has been unexpectedly found that one can influence the ability of the PTFE-fiberglass layer to conform around copper circuitry by designing a thermosetting adhesive composition of very low viscosity. The combination of a thermosetting resin, a reinforcement, and a fluoropolymer is referred to as the low loss substrate. This low loss substrate or plurality of substrates can be combined with another low loss substrate such as PTFE-fiberglass, fluoropolymer film, or FR-4 epoxy-fiberglass prepreg in any combination or plurality of combinations, or a reinforcement such as fiberglass that may or may not comprise a thermoplastic or thermosetting resin, to yield a prepreg layer or a copper clad laminate.

SUMMARY OF THE INVENTION

In one aspect, the present invention relates to a process for fabricating a low loss multilayer printed circuit board using a bonding ply comprising a fluoropolymer substrate and a thermosetting adhesive composition. The fluoropolymer composite comprises at least one fluoropolymer and a substrate selected from fluoropolymer impregnated woven fabrics, nonwoven fabrics and polymeric films. The resulting electrical properties have a dissipation factor less than 0.005 and a dielectric constant less than 4.0.

In a further embodiment, the invention relates to a low loss bonding ply that unexpectedly reforms during lamination to conform to the outline of print and etched circuitry such that less mass of thermosetting resin is required to fill gaps in copper circuitry. This ability to reform during lamination is enabled by a high flowing thermosetting resin system. This ability to conform to the outline of circuitry is not limited to the thermosetting resin system. The PTFE-fiberglass layer unexpectedly participates in gap filling by reforming around circuitry.

In another aspect, the invention relates to a multilayer printed circuit board comprising a plurality of printed circuit board layers bonded together by means of the same bonding ply.

In yet another aspect, the invention relates to a composition comprising a fluoropolymer composite comprising at least one fluoropolymer and a substrate selected from fluoropolymer impregnated woven fabrics, nonwoven fabrics and polymeric films; and a thermosetting adhesive composition that is combined to form a prepreg or a copper clad laminate.

In another aspect, the invention comprises any combination of a low loss substrate containing a fluoropolymer and a reinforcement with a thermosetting resin that may or may not be reinforced to form a prepreg or a copper clad laminate.

In another embodiment, the invention further comprises combining a prepreg that could be a low loss substrate such as PTFE-fiberglass, a polymeric film such as skived PTFE, a low loss substrate such as PTFE-fiberglass-thermosetting resin system, or a high loss substrate or prepreg such as FR-4 epoxy-fiberglass to form a copper clad laminate or a prepreg consisting of any one of the above or a plurality of the above to form a multilayered prepreg serving as one prepreg or to form a copper clad laminate.

In a further aspect, any one of the low loss or high loss substrates alone or in combination may have some level of porosity due to laser ablation and be combined in any fashion as above to form a combined prepreg layer.

DETAILED DESCRIPTION OF THE INVENTION

The present invention relates to a process for fabricating a low loss multilayer printed circuit board using a laminate or a prepreg with a dissipation factor less than 0.005 and a dielectric constant less than or equal to 4.0. The process comprises laminating together a plurality of printed circuit board layers by means of at least one thermosetting adhesive-coated fluoropolymer composite bonding ply. The bonding ply comprises a fluoropolymer composite and a thermosetting adhesive composition; the fluoropolymer composite comprises at least one fluoropolymer and a substrate selected from fluoropolymer impregnated woven fabrics, nonwoven fabrics and films.

PTFE copper clad laminate suppliers currently sell composites consisting of PTFE and either fiberglass or chopped fiber. Woven fiberglass is preferably coated with PTFE at 700° F. (371 ° C.) to a desired thickness. Generally, multiple coating passes are necessary to sequentially build layers of PTFE such that a composite is obtained having the desired thickness. The coated fiberglass is then sandwiched between copper to form a composite consisting of a component that is electrically conductive (the copper) and a component that is not (PTFE/fiberglass).

Figure 1:
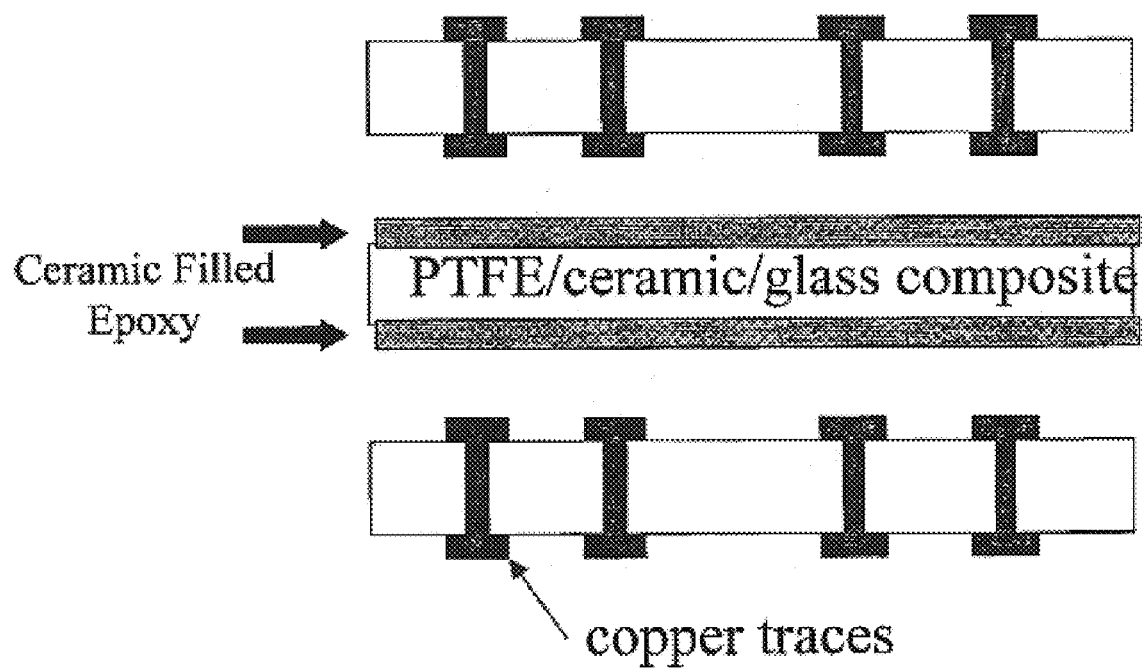
FIG. 1. Schematic of a low loss substrate comprising a fluoropolymer, PTFE, a reinforcement, woven Fiberglass, a thermosetting resin, useful for the low temperature lamination of print and etched inner layers to make a multilayer circuit board.

Disclosed herein is a process that enables circuit board fabricators to connect multiple layers of low loss substrates, print and etched inner layers of any resin type, together at reasonable fabrication temperatures (≅350° F./177° C.). One embodiment of the invention disclosed herein is a hybrid composite that has the advantages of PTFE but can be processed like a low temperature thermoset. FIG. 1 shows a low signal loss microwave circuit bonding ply that can be used to connect two double sided circuit boards (PTFE/fiberglass double sided circuits). The thermosetting resin (adhesive) can be thought of as the adhesive that holds the printed circuit boards together. During epoxy lamination, for example, the printed circuit boards can be withdrawn from a press rapidly after holding at their curing temperature and placed in a cooling press.

The reinforced first phase (fluoropolymer composite) can be prepared by impregnating, for example, woven fiberglass in a roll to roll fashion using a dip-coating process or a dual reverse roll coating process. Sequential buildup facilitates the manufacturing of the overall composite. Woven glass fabric is conveniently impregnated with PTFE dispersion or a common fluoropolymer aqueous dispersion in a multi-pass process to a desired thickness or build weight. Coating is continued until a homogenous sheet is formed where the glass fabric may or may not be completely coated.

When the reinforcement is woven fiberglass or nonwoven fiberglass and the low loss resin is a fluoropolymer such as PTFE, it is preferred that the initial coating of the reinforcement occur by depositing a silane containing PTFE dispersion onto a silane treated reinforcement. One embodiment of this invention is the need to obtain good adhesion between the reinforcement (fiberglass) and the low loss resin (PTFE). A lack of adhesion between the two components will lead poor peel strengths, blistering during thermal excursions during the preparation of printed circuit boards, mechanical separation of the laminates during routing, and separation around drilled plated through holes that manifest itself as white halos. Because the invention described herein comprises a fluoropolymer and a reinforcement that are exposed to only modest lamination temperatures, temperatures necessary for the preparation of conventional thermosets such as epoxy, 170° C. for example, it cannot be anticipated that the PTFE can be pressed into the fiberglass such that no voids occur. Because PTFE does not reach its gel temperature until 320° C. and because it is a resin that does not flow in the sense of a conventional injection moldable thermoplastic, it fuses, there must be special attention to the adhesion of the fluoropolymer to the reinforcement. It cannot be anticipated that the PTFE is compressed into the smallest spaces within the fiberglass microfilaments at 170° C., conventional epoxy fabrication temperatures, when in fact PTFE is conventionally pressed into fiberglass near its gel temperature of 325° C. by PTFE-fiberglass laminate suppliers. For these reasons, it is a preferred embodiment that the first deposition of the fluoropolymer be conducted at low enough viscosities to obtain good adhesion of the resin to the reinforcement. It is preferred that if a waterborne fluoropolymer is used such as PTFE, that the viscosity of the initial coating be such so as to not compromise the initial impregnation into the reinforcement. It is anticipated that a viscosity greater than 20 cp would probably start to compromise this impregnation, with viscosities greater than 100 cp very likely to compromise the adhesion of the resin to the fiberglass. For these reasons, it is preferred that the fluoropolymer is deposited onto the reinforcement in a layered fashion, such that the first layer is a filler-free fluoropolymer composition, that is, it contains no ceramic dielectric modifiers or other fillers that would impact the adhesion to the reinforcement, followed by subsequent layers that may or may not contain ceramics to modify the electrical properties. Subsequently deposited layers may contain a finely divided ceramic material distributed in a fluoropolymer composition.

Impregnation of the reinforcement is critical to the survival of the laminate during the many processing steps in a printed circuit board shop. This is largely dependent on the first impregnation of the reinforcement. One embodiment of this invention is the use of a melt flowing fluoropolymer during the first impregnation pass of the reinforcement. This could include copolymers of PTFE and perfluorinated methylvinylether or perfluorinated propylvinylether. It is preferred that this melt flowing fluoropolymer be combined with a silane coupling agent to resist wet chemical migration and improve the adhesion to the reinforcement. It is preferred that the melt flowing fluoropolymer has a melting point at least at or around 300° C. such that it does not flow during hot air solder leveling or sweat bonding. It should have a high melting point and a low enough melt viscosity to flow into the fiberglass.

One large deficit of the Unexamined Japanese Patent Application 6-322157 is that it teaches applying a ceramic modified polysulfone varnish to a reinforcement. 100 phr of thermoplastic to 100 to 600 phr of ceramic modifier is suggested. 100 to 600 phr of a high dielectric constant ceramic modifier combined with 100 phr of PTFE would not impregnate many reinforcements such as 1080 type fiberglass because the resin viscosity would be unacceptably high to fill the spaces between 5 micron microfilaments. PTFE is not a melt flowing fluoropolymer. It will compress to some degree and fuse but it does not flow. An injection moldable grade polysulfone would be expected to flow better into the small cavities in a finely woven fiberglass such as 1080, however, this may not occur if the polysulfone is highly loaded with ceramic, the viscosity is very high, and the ceramic particles are of such size to prevent impregnation into the fiberglass. Because the scope of the invention is to conduct lamination at epoxy temperatures, poor impregnation could not be overcome with low lamination temperatures, epoxy processing temperatures of 170° C. being well removed from PTFE fusing temperature of 320° C. 6-322157 anticipates the problems of poor adhesion, void formation, and lack of flow, yet it is suggested that a porous state is acceptable as long as the ceramic modifier does not fall out and separate from the glass cloth. PTFE based printed circuit board composites having voiding at the reinforcement level is not acceptable. The process of drilling a printed circuit board exposes the resin-to-reinforcement interface. The wet chemicals used for the treatment of drilled holes and for subsequent copper deposition then wick into voided areas and are encapsulated within the printed circuit board during copper plating of the plated through hole. This condition leads to blistering during thermal excursion as volatiles rush to escape during solder reflow, for example, or solder mask curing. These problems are overcome by impregnating a reinforcement first with a PTFE dispersion that has a very low viscosity, 20 cp for example, that additionally contains a coupling agent for adhesion to the reinforcement. Low levels of ceramic could possibly be tolerated if they did not result in an appreciable increase in viscosity and if they did not retard the impregnation of the reinforcement.

A fluoropolymer impregnated woven fabric comprises a woven fabric that has been lightly impregnated with a fluoropolymer layer to insulate the fiberglass layer from any subsequent fluoropolymer coating layer that may contain ceramic that would lead to voiding, poor adhesion to the fiberglass, blistering, or haloing during drilling. While not preferred, this fluoropolymer impregnated woven fabric could contain modest quantities of ceramic only so long as it did not compromise the properties listed previously.

It is a preferred embodiment of this invention that the fluoropolymer resin be cast onto a substrate. The substrate may or may not be a reinforcement. Suitable substrates include: woven or non-woven fabrics; crossplies of unidirectional tape; a polymeric film; or a metallic film. Metallic films include copper, aluminum, and the various grades of steel. Polymeric films include Kapton® (available from Dupont), and Upilex® (available from UBE industries), a polyimide based on biphenyltetracarboxylic dianhydride and either of p-phenylenediamine or 4,4' diaminodiphenylether. Woven fabrics can be prepared from glass filaments or filaments based on various polymers. Suitable organic polymeric fibers consist of the following: PTFE or other fluoropolymer fibers; polyaramides such as Teijin's Technora based on p-phenylenediamine and 3,4'-diaminodiphenylether, meta aramids such as Nomex® based on poly(m-phenyleneisophthalamide); liquid crystalline polyesters such as those based on hydroxynapthoic acid and hydroxybenzoic acid; polyetheretherketones (PEEK®, available from Victrex USA); polybenzoxazole (PBO, available from Toyobo); and polyimides. These polymeric fibers can be used to make woven fabrics or they can be chopped or pulped and used to make non-woven fabrics. In the preparation of non-woven fabrics, blends of different fibers might be used, or blends containing chopped glass fiber can be used. Non-woven fabric has the advantage that very thin laminates can be prepared. Because the fibers are random, improved drilled holes can be obtained, regardless of the drilling technique, laser or mechanical. Low in-plane CTE results in exceptional layer to layer registration. The non-woven fabric can be coated roll to roll in a typical dipcoating process or alternatively staple-pulped fiber can be added to an aqueous PTFE dispersion and coated onto a release substrate. In another embodiment, a fluoropolymer coating can be applied to the fabric by hot roll laminating a fluoropolymer film or a fluoropolymer skived material into the fabric thus eliminating the need for multiple coating passes. The film may or may not contain a ceramic dielectric modifier.

Woven glass reinforced composites could be prepared from the following glass styles (E, D, S, NE), or mixtures thereof. Newly developed NE glass styles available from Nittobo (Japan) have lower loss characteristics but have a cost disadvantage. Glass fabric based on 4–6 micron filaments is preferred from a drilling perspective. Typical glass styles that are preferred include: 106, 1080, 2112, 2113, 2116, and 7628. For laser drilling applications the smaller diameter based glass fabrics are preferred. The fiberglass must be largely free of sizing agents used to weave fiberglass. Secondly, the fiberglass must be treated with a silane coupling agent to resist wet chemical migration and to improve the adhesion of the fiberglass reinforcement to the silane containing first impregnation pass of fluoropolymer. A lack of silane will lead to defective areas where the low loss substrate has been mechanically drilled as indicated by white halos around the holes. For these reasons standard PTFE impregnated fiberglass that might be used in industrial applications is not suitable for electrical laminate applications.

Flat glasses are woven fiberglasses derived from low twist or zero twist yarns. In the weaving process, yarn bundles are typically twisted such that they can be readily woven without the bundles losing their integrity. Generally the warp yarns are pulled under tension through a device and the fill yarns are inserted across the rows of warp yarns using a rapier or air jet loom, for example. Low twist yarns have straighter filaments than can be more readily flattened. The fiberglass can be prepared by starting with zero or low twist yarns that may or may not be somewhat flat or they can be flattened in a post weaving process where the yarns are mechanically flattened or the yarns can be flattened due to an impinging spray.

Figure 9A:
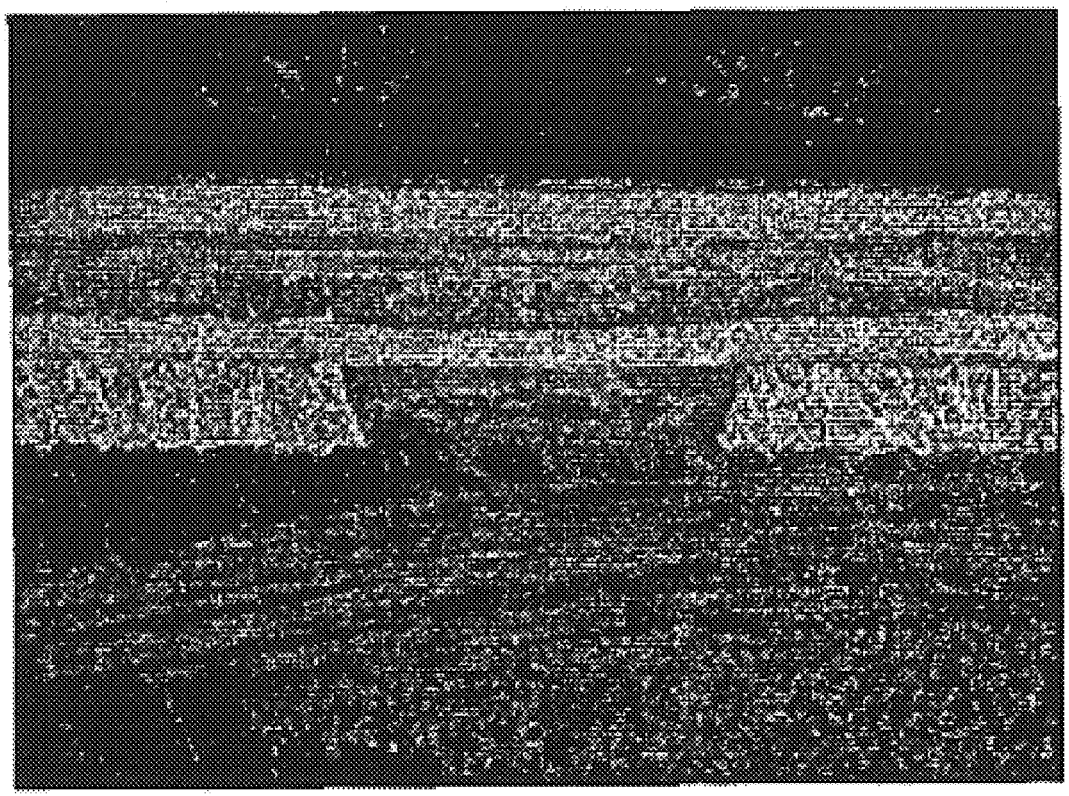
FIG. 9. A low loss substrate comprising a thermosetting adhesive and a fluoropolymer impregnated woven fiberglass, that is used to bond together inner layers that are populated with 1 and 2 oz copper traces. 9A shows a photomicrograph where one ply of bonding ply has lead to voiding. 9B shows a photomicrograph where two bonding plies have not overcome this problem of voiding.
Figure 9B:
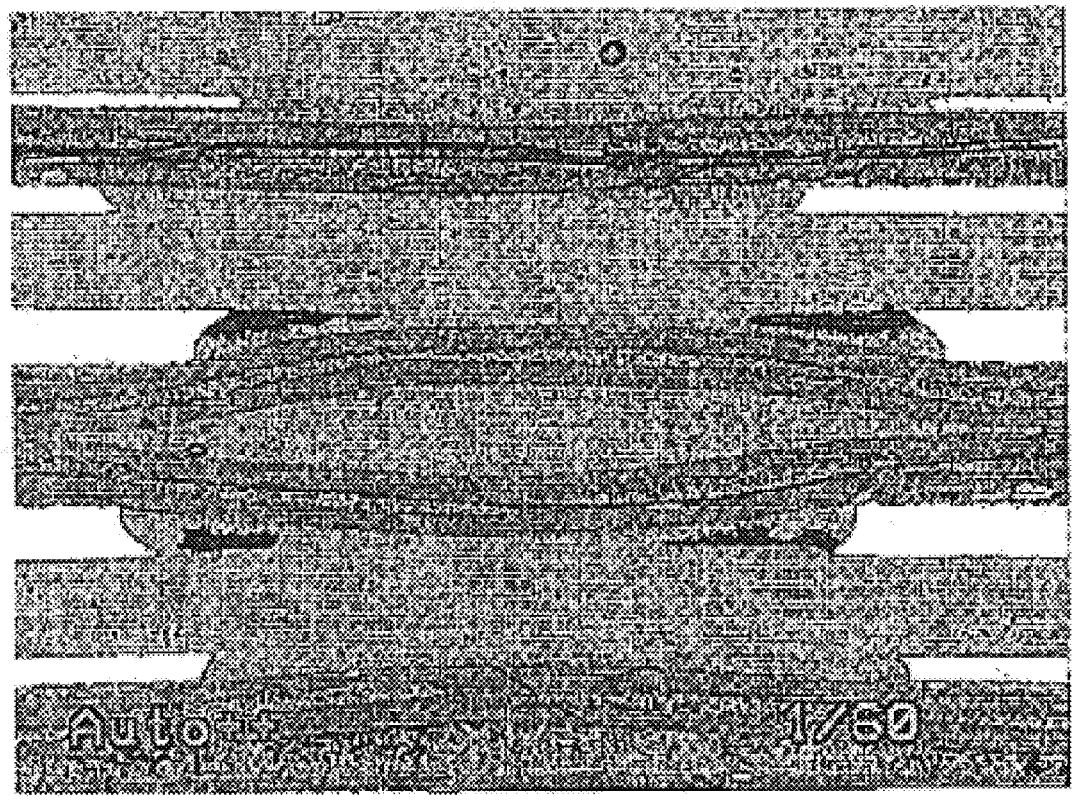

The embodiment of this invention can be envisioned or modeled like a resin coated copper system. In this invention, a given amount of resin is disposed over the surface of a flat fluoropolymer substrate. The thermosetting component of the invention is expected to fill the gaps created by the manufacture of interlayer circuitry. It is known from resin coated foils, that a given amount of resin is necessary to fill certain types of copper circuitry. It is believed that 35 microns of flowable resin in a resin coated copper approach is necessary to fill 1 oz copper (36 microns) and that 50 microns of flowable resin is necessary to fill 2 oz copper (72 microns). A lack of resin will lead to voiding as shown in FIG. 9. To the extent that the fluoropolymer substrate is not flat, resin is wasted filling those cavities. Because the flexible PTFE coated fiberglass has the ability to conform to the contour of innerlayer circuitry (innerlayer is the correction terminology), this invention has the advantage that less resin is required to fill copper gaps. For these reasons the viscosity of the thermosetting adhesive over the temperature range used for pressing by a pwb fabricator is critical. If the thermosetting adhesive has a high viscosity voiding will occur as shown in FIG. 9. For this reason it is critical that the thermosetting adhesive have a melt viscosity less than 100 Pa*s over the temperature range used for pressing (room temperature to 200° C.). Higher viscosities can be overcome by application of high pressures during lamination. However most pwb fabricators do not have lamination presses that exceed 500 psi over a large platen size such as a 36"×48" footprint. Therefore, to move adhesive from areas where it is not needed to areas where it is needed, to fill gaps between copper circuitry, the melt viscosity must be less than 100 Pa*s for a long enough time to eliminate voiding. A melt viscosity less than 100 Pa*s (5 rad/s, 5% strain) over the lamination temperatures of interest will be used to describe a high flowing thermosetting resin system.

Figure 11A:
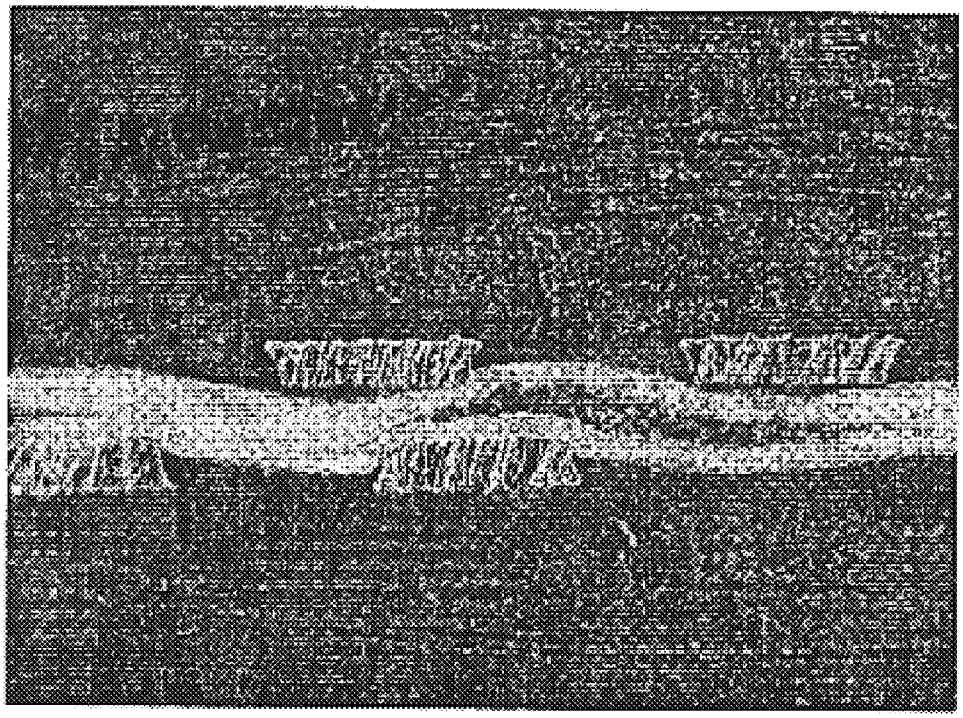
FIG. 11. A low loss "conformal" bonding ply substrate used to bond together 2 FR-4 based print and etched inner layers.
Figure 11B:
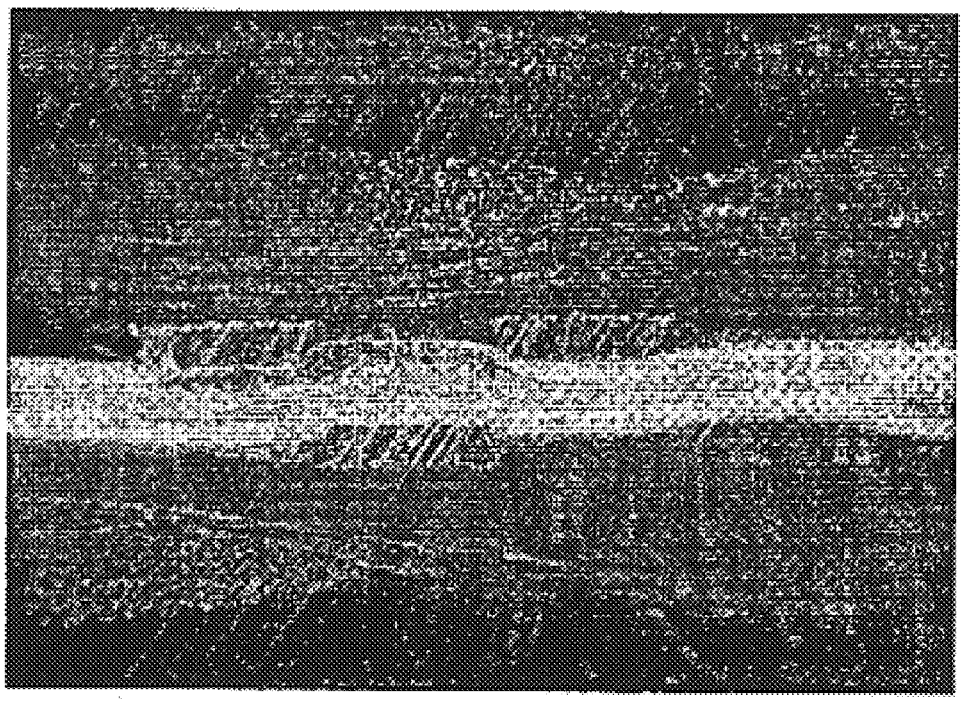
Figure 11C:
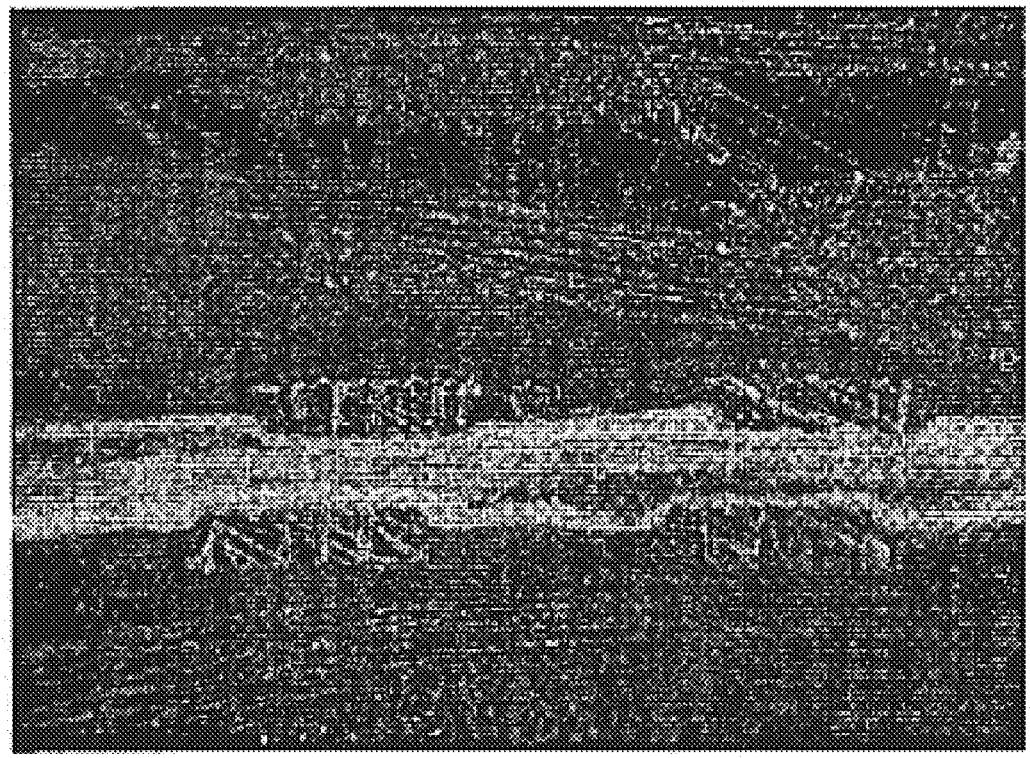

A high flowing thermosetting resin system also enables the PTFE-fiberglass to conform to the outline of copper circuitry. A low flowing formulation of high viscosity will more readily lead to a final composition where the PTFE-fiberglass layer is fairly flat when disposed between opposing layers of print and etched copper circuitry. However, when the thermosetting resin is high flowing, the PTFE-fiberglass layer can reform during lamination such that the PTFE-fiberglass itself will help fill the gaps in copper circuitry. FIG. 11 shows bundles of PTFE coated fiberglass that have moved into the gaps between the copper circuitry. This allows the movement of the thermosetting resin from areas of high pressure to areas of low pressure. FIG. 11 also shows a bonding prepreg layer where the thermosetting layer has flowed away from the copper trace such that the PTFE-fiberglass layer is disposed directly on top of the copper trace and the high flowing thermosetting resin has moved between the copper circuitry. This degree of "reformability" of the PTFE-fiberglass layer is promoted by a high flowing thermosetting resin system that consists predominantly of low molecular weight resins, preferably non advanced and not highly polyfunctional such that a high crosslink density is achieved quickly, as indicated by a low gel time, such that a wide processing window is available before the rapid build up of viscosity.

The viscosity of the thermosetting adhesive over the lamination temperature has a second critical function. Polytetrafluoroethylene and related fluoropolymers are some of the lowest loss materials available in the marketplace today. Other thermosetting resin systems have to be considered higher loss materials. This is true because non fluorinated materials must be flame retarded resulting in an elevation of the dissipation factor. Therefore, thermosetting adhesive formulations that have very low viscosity and high flow can be expected to flow out of the laminate. It is an unexpected benefit when the highest loss component, the thermoset, flows out of the laminate. It is only desirable to leave the minimum amount of thermoset possible to fill gaps in copper circuitry.

This can be obtained by optimizing the following variables: the gel time of the resin, the degree of advancement of the resin during B-staging, and the viscosity of the thermoset as it cures. The gel time can be manipulated by decreasing the concentration of chemical groups crosslinking, by eliminating the use of multifunctional chemical groups such as trifunctional epoxies or phenol novolacs that are somewhat advanced by nature, by eliminating or limiting the use of chain extended epoxies or chain extended moieties of any chemical nature, by varying or reducing the catalyst concentration, and by adding reactive diluents that are known to increase the gel time of a thermoset. Alkyl substituted mono glycidyl ethers (C8–C14, Heloxy Modifier 7 or 8 from Resolution Performance Products) are monofunctional epoxies that reduce thermoset crosslink density and lead to a slower cure rate. Phenyl glycidyl ether is another example. Polyfunctional alkyl substituted glycidyl ethers (Heloxy Modifiers 84, a trifunctional glycidyl ether based on an aliphatic triol) are less effective yet they result in less of a compromise. Epoxies based on aliphatic alcohols are less reactive than epoxies based on aromatic alcohols. Modifiers that increase the total mass relative to the epoxy, the mass or equivalent weight per epoxy, reduce the reaction rate of the epoxy. Simply, the lower the chemical concentration the longer the gel time and the longer the time the thermoset will spend at a low viscosity before curing.

The amount of mass of thermosetting resin is critical. Each side of the low loss substrate must contain a minimum of 0.25 lbs/yd$^2$ of adhesive to fill 0.5 oz circuitry to 0.75 lbs/yd$^2$ to fill 2 oz circuitry. This will vary a little bit depending on the design, the density of the traces involved, the spacing of the traces to each other, whether or not there are stacked layers of opposing traces over a very thick multilayer printed circuit board, 16 layers for example. If a 16 layer circuit board is prepared and each layer contains traces of 1 oz circuitry in the same spots and voids in the same spots, conceivably there could be 20 mils extra of copper thickness in one location leading to an area of high pressure during lamination, while the gap areas have 20 mil less of mass leading to a low pressure zone, the result being an area of very little pressure if any to push thermosetting adhesive into the cavities. For these reasons it is critical that enough thermosetting resin is available to fill a given volume between traces and that the thermosetting adhesive has a low enough viscosity for a long enough time to move from areas of high pressure to low pressure.

Woven glass fabrics are particularly suitable as substrates for the fluoropolymer composite. Examples of such woven glass include 7628, 1080, or 106 style glasses with a 508 heat cleaned finish produced by Hexcel Schwebel.

Figure 8:
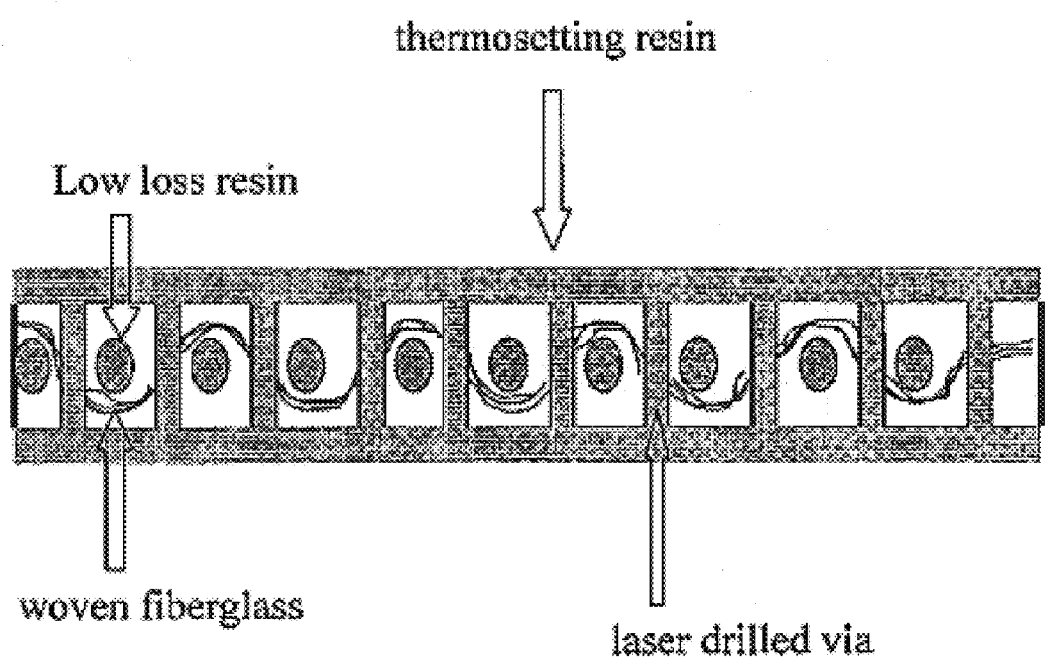
FIG. 8. Schematic of a prepreg material comprising a PTFE-fiberglass low loss substrate with controlled porosity that has been filled with a thermosetting resin.

One further embodiment of the invention is that the fluoropolymer coated fiberglass, the low loss substrate, might be perforated before application of the thermosetting resin. One disadvantage of the original embodiment is that the thermosetting resin is not able to flow through the uniform layer of PTFE/fiberglass. For this reason, thermosetting resin that might be disposed above the PTFE/fiberglass sheet is not available to fill gaps between copper traces in a layer located below the PTFE/fiberglass. In the ideal state, all of the thermosetting resin that is coated onto both sides of the PTFE/fiberglass is present to fill the gaps in the copper traces created by the print and etch process. A schematic of the embodiment is shown in FIG. 8. Perforation of the PTFE/fiberglass sheet can be achieved using a mechanical cutting method or a laser drilling process. Although FIG. 8 shows the laser drilled holes between fiberglass bundles, it is envisioned that the laser drilled holes would be spaced in such a way to achieve good copper trace gap filling. Therefore the laser drilled holes would not necessarily conform to any features of the fiberglass but rather to a drilling pattern necessary to create a permeable enough membrane to allow thermosetting resin to readily flow from side to side. It is envisioned that while FIG. 8 represents a rather uniform hole, it is recognized that a laser drilled hole or a mechanically drilled hole would not be perfectly cylindrical, nor would the holes appear similar because each drilled hole would be created from a potentially minutely different fiberglass topography. Using this embodiment of the invention, a plurality of fluoropolymer coatings would be necessary to impregnate the fiberglass, followed by a step to create the via holes, followed by a step to surface treat the via to get good adhesion between the via hole wall and the thermosetting resin that will be subsequently coated onto the surface and into the via holes. Alternatively, fiberglass could be lightly coated with PTFE, the substrate perforated, followed by further coatings of PTFE that do not successfully close the holes, followed by a subsequent deposition of a thermosetting resin.

The advantage of this improvement is that it allows the creation of a fill layer where more of the mass can be considered useful for gap filling. This is particularly advantageous for thinner substrates, from 1–3 mil, where thick building blocks of two thermosetting layers separated by a PTFE/fiberglass layer would render the product too thick to be appropriate. In the ideal state, the entire mass would be available for gap filling/conformal filling. However, if enough of the woven fiberglass structure is retained to yield some level of a continuous reinforcement, a higher degree of controlled dimensional movement can be achieved during standard printed circuit board fabrication steps.

Various fluoropolymers can be used to prepare the reinforced first phase. Polytetrafluoroethylene (PTFE) or modified polytetrafluoroethylene is well known to those skilled in the art. Modified PTFE contains from 0.01% to 15% of a comonomer which enable the particles to fuse better into a continuous film. PTFE is typically modified with a small quantity of a fluorinated alkyl vinyl ether, vinylidene fluoride, hexafluoropropylene, chlorotrifluoroethylene, and the like. High level of modification leads to polymers such as PFA poly(perfluorinatedalkylvinylether-tetrafluoroethylene) or FEP poly(perfluorinatedtetrafluoroethylene-hexafluoropropylene). Other fluoropolymers which may serve as a dielectric include: polychlorotrifluoroethylene; copolymers of chlorotrifluoroethylene with vinylidene fluoride, ethylene, tetrafluoroethylene, and the like; polyvinylfluoride; polyvinylidenefluoride; and copolymers or terpolymers of vinylidene fluoride with TFE, HFP, and the like; and copolymers containing fluorinated alkylvinylethers. Other fluorinated, non-fluorinated, or partially fluorinated monomers that might be used to manufacture a copolymer or terpolymer with the previously described monomers might include: perfluorinated dioxozoles or alkyl substituted dioxozoles; perfluorinated or partially fluorinated butadienes; vinylesters; alkylvinyl ethers; and the like. Hydrogenated fluorocarbons from C2–C8 are also envisioned. These would include trifluoroethylene, hexafluoroisobutene, and the like. Fluoroelastomers including the following are also envisioned: HFP with VDF; HFP, VDF, TFE copolymers; TFE-perfluorinated alkylvinylether copolymers; TFE copolymers with hydrocarbon comonomers such as propylene; and TFE, propylene, and vinylidene fluoride terpolymers. Fluoroelastomers can be cured using the following crosslinking agents: diamines (hexamethylenediamine); a bisphenol cure system (hexafluoroisopropylidenediphenol); peroxide (2,5-dimethyl-2,5-dit-butyl-peroxyhexane); any base that can act as a dinucleophile.

Fluoropolymer dispersions that (1) readily rewet (2) are available at low cost and (3) have low dielectric loss characteristics are preferred. Aqueous dispersions of fluoropolymers can contain a particle size from 1 nanometer to 1000 nanometers. The particle size of the fluoropolymer dispersion is not important as long as the substrate can be well impregnated. Microemulsions or blends of conventional fluoropolymer dispersions with aqueous microemulsions are also suitable. The fluoropolymer component could also be coated from a solvent vehicle onto the reinforcement.

Although it is envisioned that the reinforced low loss substrate component comprise a fluoropolymer, the low loss substrate could be comprised of a hydrocarbon polymer that could benefit from an adhesive layer that could improve the performance of the hydrocarbon resin alone. Cured elastomers such as polybutadiene, for example, are known to have poor adhesive properties and would benefit from a second layer of an adhesive phase. The rubber may be any natural or synthetic rubber or a combination thereof. Generally, the rubber may be any saturated or unsaturated polyalkylene rubber made up of ethylene, one or more alkenes with 3–8 carbon atoms, for instance, propylene and/or 1-butene, and, if desired, one or more polyethylenically unsaturated compounds, for instance, 1,4-hexadiene, dicyclopentadiene, 5-methylene-2-norbornene, 5-ethylidene-2-norbornene and 5-isopropylidene-2-norbornene. Any rubbers containing the following monomers would be anticipated: butadiene, isoprene, styrene, divinylbenzene, maleic anhydride, anhydride functionalized butadienes or other aliphatic or aromatic dienes. The rubber can therefore be any suitable natural rubber, synthetic polyisoprene, any of the neoprenes, (polychloroprene), styrene-butadiene rubbers (SBR), styrene-butadiene-divinylbenzene available from Ricon, acrylonitrile-butadiene rubbers (NBR), acrylonitrile-butadiene-styrene polymers (ABS) high molecular weight olefin polymers with or without other monomers or polymers such as butyl rubber and cis- and trans-polybutadienes, bromobutyl rubber, chlorobutyl rubber, ethylene propylene rubbers, nitrile elastomers, polyacrylic rubber, polysulfide polymers, silicone elastomers, poly- and copolyesters, ethylene acrylic elastomers, vinylacetate ethylene copolymers, or chlorinated or chlorosulfonated polyethylenes, or a mixtures thereof. The rubber may also contain a ceramic modifier.

It is envisioned that the low loss substrate could comprise a ceramic, fused silica for example, a reinforcement, woven fiberglass for example, and a cured elastomer resin system, containing high and low molecular weight polymers comprised of butadiene, isoprene, maleic anhydride, anhydride functionalized butadiene or other dienes, divinylbenzene, nobornene, neoprene, or styrene. The second adhesive component then might comprise a polymeric resin system know to have better adhesive properties or better flow properties. This second adhesive component might include an epoxy, a cyanate ester, or any number of the various thermosetting resin systems known to those skilled in the art.

The surface of the fluoropolymer composite or the first phase composite can then be treated before applying the thermosetting adhesive composition to facilitate bonding therebetween. Etching techniques for modifying the surface of a fluoropolymer are known in the art. These include etching by: sodium ammonia etch, radiation, electron beam, sodium naphthalene etch, plasma using hydrogen, argon, nitrogen, carbon tetrafluoride gases, corona, vacuum discharge, and the like. Once the surface of the first phase is treated, a thermosetting resin can be applied by conventional coating methods. Depending on the amount of ceramic incorporated into the reinforced fluoropolymer substrate, surface treatment may not be necessary to obtain good adhesion to the adhesive layer. It is known to those skilled in the art that laminates having high ceramic loadings that have drilled holes may not need surface treatment before plating. The thermosetting resin is typically coated simultaneously onto both sides of the fluoropolymer composite using two reverse roll treaters, one per side. This can also be accomplished using wrapped wire wound rods. The thermosetting resin is typically prepared by driving off the solvents used to dissolve the thermosetting resin. The thermosetting resin is applied as a flat continuous film on the surface of the fluoropolymer impregnated reinforced sheet. Although it is preferred that the second component be a thermosetting resin processable at low temperatures, deposition of a thermoplastic layer onto the first component is also envisioned.

The thermosetting component is preferably a non-fluoropolymer but a thermosetting fluoropolymer is also envisioned. The thermosetting adhesive component should have a glass transition of at least 100° C. or a glass transition that is very difficult to detect by common techniques such as DMA or TMA, or a CTE that results in a total (x, y, and z) coefficient of thermal expansion in the unreinforced state of around 50–100 ppm/° C. over the temperature range 50–300° C., although less than 50 ppm/° C. would be preferred.

Typical thermosetting resin systems that could be used include: epoxies (phenol epoxy novolacs; cyclopentadiene based epoxies; brominated epoxies; diamine cured epoxy resin systems (diaminodiphenylsulfone); trisepoxies; multifunctional epoxies; styrene-maleic anhydride copolymers cured with epoxies or polyamines; norbornene-maleic anhydride copolymers cured with epoxies or polyamines; bicyclic alkane compounds of the general structure bicyclo [x.y.z.]alkane-anhydride copolymers cured with epoxies; cyanate ester resins such as those based on bisphenol A or novolac resins; cyanate ester resins cured with epoxies; polynorbornene cured with a free radical generator; polynorbornene blends containing, for example, any combination of polybutadiene or polyisoprene; free radically cured polybutadiene of varying molecular weights with optionally polyisoprene; acetylene functionalized polyimide; functionalized polyphenylene oxide and blends of functionalized PPO with epoxies; bis-triazine resin systems with the optional addition of epoxies; multifunctional aziridines; poly (bismaleimides), specifically bismaleimides based on diaminodiphenylmethane; and bismaleimides cured with diallylbisphenol A or other bisallylphenyl compounds; norbornene terminated polyimides, poly(bis phenylcyclobutane); free radically cured unsaturated polyesters; and the like. Other non fluorinated adhesive layers could also include: polymethylvinylether; polyvinylpyrrolidone; polybutadiene; copolymers of polybutadiene and styrene; elastomers containing any combinations of butadiene, isoprene, styrene, or neoprene, divinylbenzene, anhydride functionalized butadienes, maleic andhydride, elastomers of ethylene and propylene; elastomers of acrylonitrile and butadiene; elastomers of butadiene-styrene-divinylbenzene, and the like. The thermosetting resin system does not include lightly crosslinked pressure sensitive adhesives which have a low glass transition temperature.

The adhesive layer could also include a fluorelastomer. Fluoroelastomers include the following: copolymers of vinylidene fluoride and hexafluoropropylene; copolymers of hexafluoropropylene, vinylidene fluoride, and tetrafluoroethylene; copolymers of vinylidene fluoride and perfluoroalkyl vinylethers with or without tetrafluoroethylene; copolymers of tetrafluoroethylene with propylene; copolymers of tetrafluoroethylene with perfluoroalkylvinylethers; a terpolymer of propylene, vinylidene fluoride, and tetrafluoroethylene. Fluoroelastomers can be cured using the following crosslinking agents: diamines (hexamethylenediamine); a bisphenol cure system (hexafluoroisopropylidenediphenol); peroxide (2,5-dimethyl-2,5-dit-butyl-peroxyhexane); any base that can act as a dinucleophile. In some cases it might be preferred to incorporate a cure site monomer into the polymer backbone to promote curing. These might include halogen-containing olefins such as 1-bromo-2,2-difluoroethylene or 4-bromo-3, 3,4,4-tetrafluoro-butene. Other cure site monomers might include nitrile containing vinylethers and hydrogen containing olefins.

Either the thermosetting resin adhesive component or the reinforced low loss substrate (PTFE-fiberglass) or both may optionally contain any one or combination of a number of ceramic dielectric constant modifiers. These ceramic modifiers are typically polymeric, inorganic, ceramic, or organometallic. Ceramic modifiers are used to modify the electrical, thermal, improve the dimensional stability of the laminate, and reduce cost. It is well known that the addition of various ceramics will reduce the coefficient of thermal expansion of the composite, a reduction in the z axis being highly desirable for the reliability of plated through holes. X-Y CTE reduction enables smaller copper pads to be used and less layer to layer misregistration.

In many cases, ceramics are added to tailor the dielectric constant of the composite. Ceramics typically include: quartz, alumina, titanium dioxide, strontium titanate, barium titanate, alumina, fused, colloidal, or fused silica, chopped glass fiber, magnesia, aluminum silicate (kaolin), steatite, zircon, quartz, boron nitride, silicon nitride, aluminum nitride, silicon carbide, talc, beryllia, barium titanate, mica, hollow or solid glass spheres. For a laminate or prepreg having a dielectric constant less than 4.0, the choice of ceramics is limited. The preferred ceramics are fused silica, quartz, kaolin, talc, alumina, and titanium dioxide. Ceramics with a dielectric constant above 4.0 in the natural state, such as talc, alumina and titanium dioxide would have to be limited in order to minimize their contribution to an increased dielectric constant. The preferred embodiment comprises a dominant proportion of the ceramic to be less than a Dk of 4.0, fused silica for example, with a minor component of a high dielectric constant material used only to modify the dielectric constant slightly. Some high dielectric constant ceramics such as titanium dioxide have a much lower effective dielectric constant when used as a particulate powder and combined with other materials such as PTFE.

It is also envisioned that the addition of certain polymeric fillers available as powders could be advantageous. These include: including PTFE, crosslinked PTFE, available as either a powder or a dispersion, polyetherketones, polyetheretherketones, polyphenylenesulfide, polyethersufone, polyimide, polyester, liquid crystalline polyester, polyamide, polyesteramide, polybutadiene rubber, and other elastomeric materials which might include butadiene, isoprene, neoprene, dicyclopentadiene, styrene, divinylbenzene, and maleic anhydride. Low loss fillers that can be readily dispersed in a solvent-borne matrix are preferred. For aqueous dispersions, small particle powders are preferred. PTFE powders can be dispersed in either of the thermosetting varnish or the fluoropolymer-fiberglass low loss substrate.

Polytetrafluoroethylene powders of controlled particle size are preferred. PTFE has the advantage of very low loss relative to the inorganic fillers. PTFE has the further advantage of less drill wear relative to a hard filler such as fused silica. It has been unexpectedly found that PTFE can be readily dispersed in a thermosetting resin solution to reduce the resulting loss at 10 GHz. PTFE is a lubricant and is also expected to help lubricate the bit during drilling. A laminate comprised of PTFE powder, a thermosetting resin, copper, and a reinforcement is also envisioned.

The introduction of particulate ceramic modifiers, particularly inorganic ceramics, into a printed circuit board laminate is not without its drawbacks. The ceramics introduce another interface into the composite that can be a source of moisture absorption leading to blistering and delamination upon exposure of the board to wet chemistry steps (print and etch), followed by exposure to higher temperatures during sweat soldering or hot air solder leveling. The proximity of the ceramic to the glass or polymeric reinforcement may lead to a weak boundary region between interfaces leading to a laminate that is susceptible to delamination, blistering, or the plating of unwanted metals. In addition, the ceramics generally do more damage to a mechanical drill bit during the preparation of plated through holes. This exposure of new ceramic surface area during mechanical drilling might also be a source of failure. It has been previously disclosed in the art to pre-coat the surface of the particulate with a hydrophobic coating to improve the moisture resistance of the resulting composite which is also claimed to improve the adhesion of the particle to the matrix materials. (U.S. Pat. Nos. 5,024,871, 4,849,284, and 5,149,590). The disclosed examples specifically teach the use of hydrophobic coatings consisting of silanes, zirconates, or titanates, all well known inorganic coupling compounds. According to prior art, in a separate step, the particulate is precoated and then the precoated particle can be further formulated, extruded, or further processed in a separate step. Depending on whether the ceramic is added to a waterborne system or a solvent-borne thermosetting system, there use of a hydrophobic surface coating may or may not be required. Other technologies are available that eliminate the need for a hydrophobic coating such as an organosilane.

The surface of the ceramic is readily treated with silanes. Fused silica, for example, has a high concentration of hydroxyl groups at the surface of the particle that is dependent on the milling process. Less than 10 microns sized particles can readily be obtained in a wet milling process that leaves the surface rich in hydroxyl functionality. Silane groups can have the following functionality $R_nSiX_{(4-n)}$ where X is a leaving group consisting of alkoxy, acyloxy, amine, an chlorine group, or hydroxy as an intermediate. The R group can be an alkyl or aromatic functionality.

The particle size of ceramic modifiers is preferred to be less than 25 microns. Particles greater than one micron in size are harder to disperse, lead to uneven mechanical drilling, and can potentially protrude through copper cladding.

The dielectric properties will consequently be a combination of the thermosetting component and the low loss substrate. Therefore it is preferred to limit the thermosetting component to just a sufficient quantity to accomplish bonding of the various layers. Because an epoxy, for example, has a substantially worse dielectric loss, it is preferred to limit its use. The preferred embodiment includes coating a 0.1 to a 1.0 mil dry layer of the thermosetting resin onto the surface of the fluoropolymer coated glass composite. Because the thermosetting layer is preferably thin, inorganic or organic ceramic modifiers incorporated into the thermoset should have a sufficiently low particle size to yield a homogeneous film. The ceramic should be less than 50 microns in size, preferably less than 25 microns, and most preferred, less than 10 microns. The ceramic should be less than 80% by weight of the combined filler and thermosetting resin total dry weight, preferably from 10–60%, and most preferred from 30–60%. Ceramic concentrations that exceed the volume of the resin necessary to coat the surface of the ceramic particles and bond to the copper cladding lead to poor interlaminar adhesion and poor copper adhesion. Too low a ceramic content leads to less dimensional stability, higher cost, and in some cases a higher dissipation factor.

The thermosetting resin composition and the fluoropolymer dispersion can be coated using a number of different methods. The resin compositions can be applied to the carrier or substrate using spray coating, dipcoating, reverse roll coating, gravure coating, metering rod coating, pad coating, or any combination of the above. In the case of the fluoropolymer component, the preferred method is to dipcoat the reinforcement into a resin composition and using a metering rod control the amount of pickup of the resin composition onto the carrier or reinforcement. In the case of the thermosetting resin system, it can be metered on by a Mayer rod after dipcoating the fluoropolymer sheet into a resin bath or it can be transferred coated using a dual reverse roll controlled gap setup.

The weight ratio of the thermosetting hydrocarbon resin to the reinforced low loss substrate layer is preferably 1:1 to 1 to 50. It is more preferred that the thermosetting resin have a weight ratio of 1:2 to 1:20 to the reinforced core. It is most preferred that the surface coated thermosetting resin have a weight ratio of 1:3 to 1:10. The most preferred ratio of thermosetting resin surface coating to the reinforced core will vary depending on the low loss characteristics of the thermosetting adhesive layer, the thickness of the copper circuitry that needs to be encapsulated, the degree to which the copper is etched yielding a requirement for a volume of space that must be filled by the flowing thermosetting component, and the amount and type of ceramic that may or may not be added to the thermosetting resin composition. The previously described weight ratios take into consideration any ceramic filler that would be added to the thermosetting resin composition. Although ceramic might also be added to the low loss substrate core material, the weight ratios of the thermosetting adhesive layer to the PTFE-fiberglass layer refer to the total weight of the low loss substrate (PTFE-fiberglass), regardless whether the low loss substrate is comprised of a resin, a reinforcement, or a ceramic. The low loss substrate (PTFE-fiberglass layer) could contain up to 80 wt % ceramic modifier.

This invention also enables the incorporation of UV dyes into a fluoropolymer based printed circuit board. UV dyes are typically incorporated into FR-4 epoxy formulations to enable automated optical inspection (AOI). Many of these dyes would not be stable at the processing temperatures of many fluoropolymers. However, the UV dye can be added as an additive to the lower temperature thermosetting adhesive composition.

This invention also envisions the addition of alternative flame retardants. Organic compounds containing phosphorous are known to be suitable replacements for bromine containing organics. Triphenyl phosphate and polymer based phosphates would be further examples.

Figure 4:
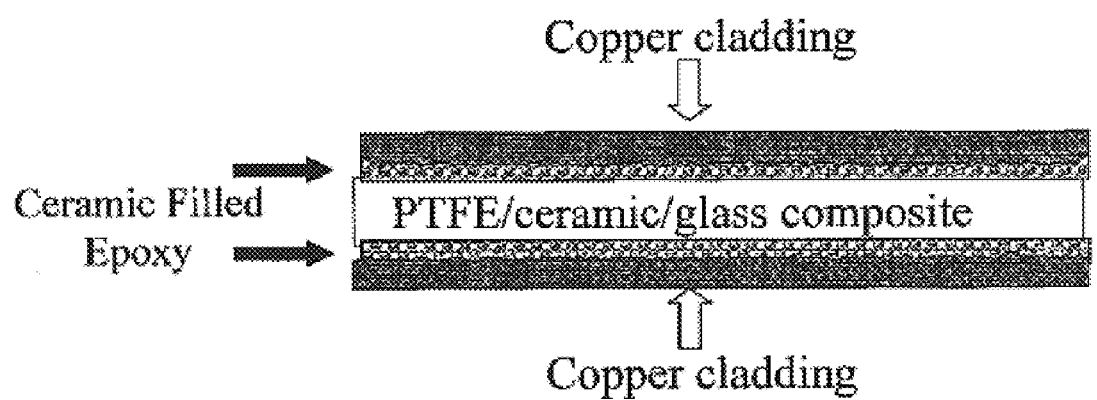
FIG. 4. Schematic of a PWB core laminate comprising a PTFE Coated Fiberglass Composite having a Thermosetting Resin Surface Coating for Low Temperature Lamination and Copper Cladding.

In an alternative embodiment of the invention, the bondply or a plurality of bondplies can be laid up with copper and pressed in a conventional FR-4 copper clad lamination press. A single bond ply can be sandwiched between coppers to make a single laminate core, as shown in FIG. 4. The choice of copper styles could include rolled or electrodeposited. The copper could be zinc free or zinc containing, low profile, very low profile, reverse treat, ultralow profile, or omega foils. Copper could also be sputtered onto the faces of the adhesive layer to obtain very thin layers of copper.

Figure 5:
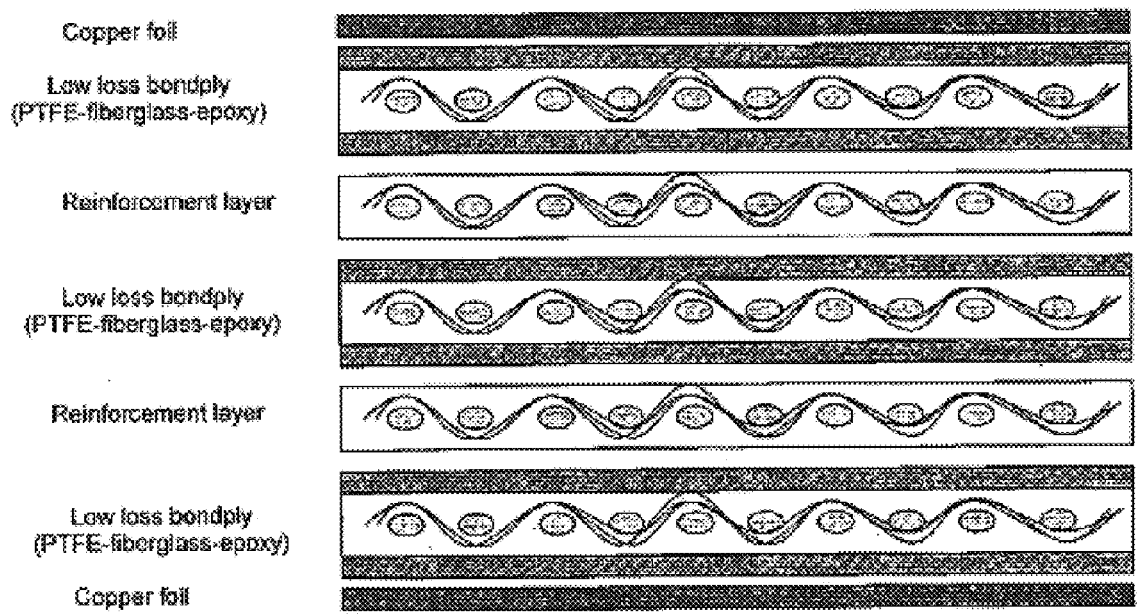
FIG. 5. Schematic of either a copper clad laminate or a prepreg layer comprising a fluoropolymer, a reinforcement, and a thermosetting resin, that is laminated together with a reinforcement, that may comprise a thermoset or thermoplastic, and either copper foil for the preparation of copper clad laminate, or laminated with print and etched inner layers during the preparation of a multilayer printed circuit board.

As yet another embodiment, the bondply can be laid up with a reinforcing layer. This reinforcing layer could include wovens, nonwovens, or films, as show in FIG. 5. The reinforcing layer could be resin impregnated or not. If resin impregnated, the resin could be any one of the thermoplastic or thermosetting resins suggested for the low loss substrate or the adhesive layer.

Figure 6:
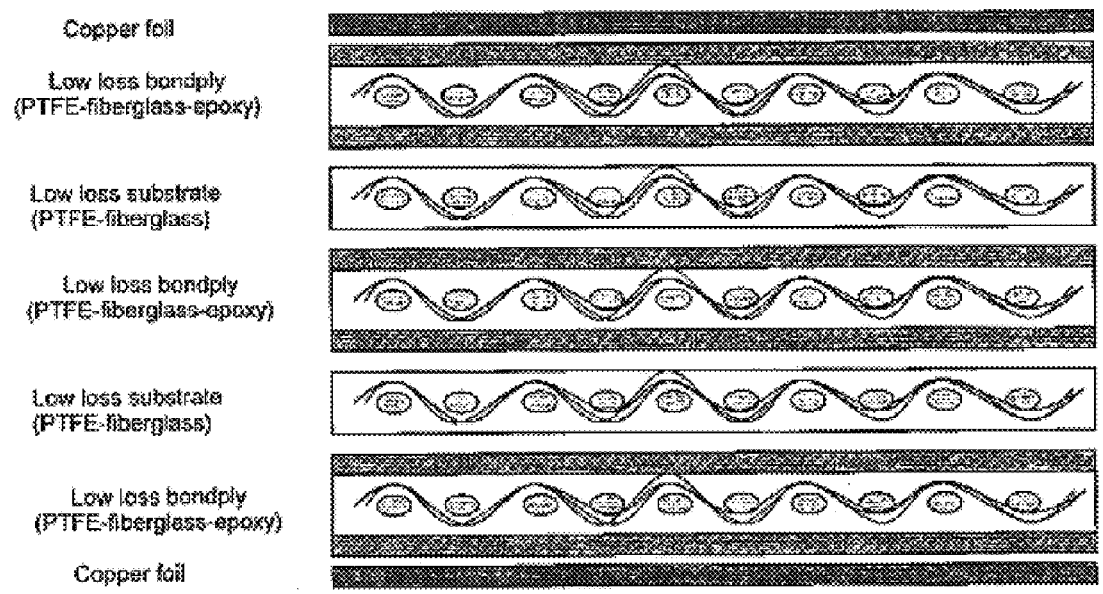
FIG. 6. Schematic of a copper clad laminate comprising fiberglass, PTFE, a thermosetting resin adhesive layer, and copper cladding, where the copper clad laminate has been produced by a process combining a low loss prepreg substrate comprising PTFE, fiberglass, a thermoset, or plurality thereof, with one or more of a low loss substrate comprising a fluoropolymer and a reinforcement.
Figure 7:
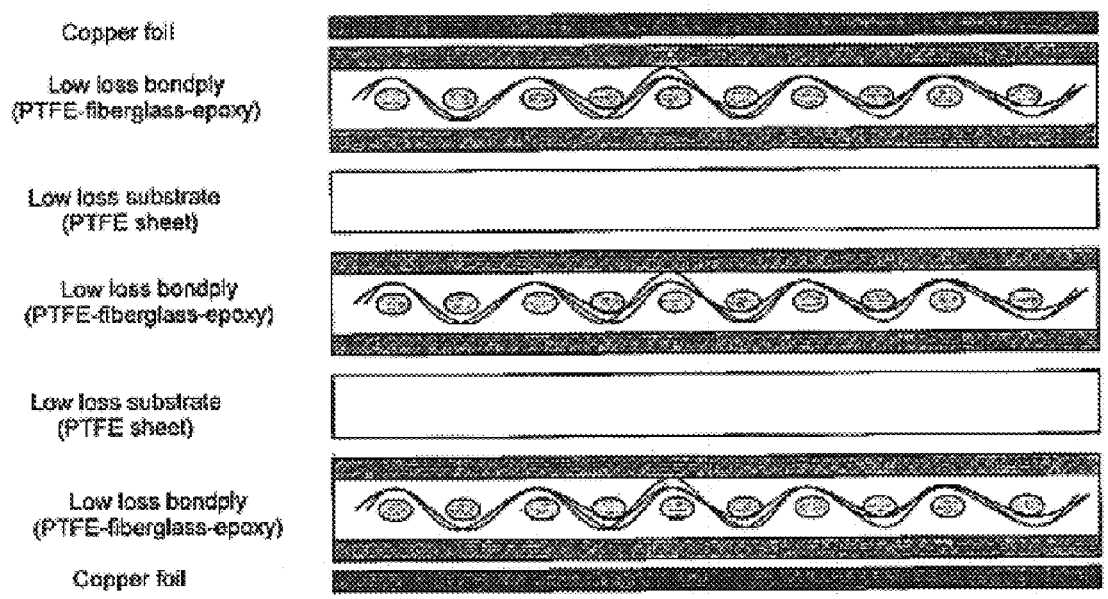
FIG. 7. Schematic of a copper clad laminate comprising fiberglass, PTFE, a thermosetting resin adhesive layer, and copper cladding, where the copper clad laminate has been produced by a process combining a low loss prepreg substrate comprising PTFE, fiberglass, a thermoset, or plurality thereof, with one or more of a low loss substrate comprising a fluoropolymer.

As a separate embodiment the bondply can be laid up with plies of low loss substrate that have no thermosetting component to them, as show in FIG. 6. The advantage of this approach is that a minimum of the thermosetting adhesive is used. The low loss substrate, PTFE-fiberglass for example, would have to be surface treated for bonding to the bondply. If an appropriate adhesive layer were used, such that adhesion to the PTFE could be achieved without a surface treatment, this would be one added benefit. For the preparation of a laminate that involved a plurality of bonding plies and a plurality of low loss substrates it would be desirable to locate the bondply facing the upper and lower copper layers for good adhesion. The low loss substrate would then be placed in alternating layers with the bondply. This approach has the advantage that half the adhesive is used between a layer of bondply and low substrate versus two plies of bonding ply that leads to a thick adhesive layer that is not used for any gap filling. The net result is less adhesive and a lower dissipation factor. The dielectric constant would also be reduced by using layers of PTFE-fiberglass. A further advantage is that half of the low loss laminate used would not have to be processed into bondply thus reducing the cost of the laminate.

A similar strategy could be employed for the preparation of very low loss laminates. Thermoset treated PTFE-fiberglass could be intermixed with layers of surface treated skived PTFE film. This would result in decreased dielectric constant, decreased dissipation factor, and a reduced cost, when compared to preparing a laminate of pure PTFE-fiberglass-thermosetting resin.

Essentially any printed circuit boards may be laminated together using a plurality of bonding plies or low loss substrates or reinforcements according to the present invention. In particular, hybrid printed circuit boards composed of epoxy fiberglass composites, such as FR-4; or laminates comprised of any of the following: PTFE; cyanate ester; polyimide; styrene; maleic anhydride; butadiene; bismaleimide; isoprene; neoprene; polyester, and others known to those skilled in the art would be suitable.

EXAMPLES

Example 1

Preparation of a Fluoropolymer Coated Woven Glass Fabric 7628 style woven fiberglass with a 508 heat cleaned finish (available from Hexcel Schwebel) was further heat cleaned in a 3 zone vertical coating tower at 7.5 feet/min. The temperatures in the 3 zones were as follows: 121° C., 204° C., and 418° C. A 5% solution of 3-amin in water was then applied to the fabric using a smooth metering rod. The fabric was fed into a dip basin and the pickup was controlled by the smooth metering rod on each side of the fabric. Oven temperatures were: 121° C., 177° C., and 260° C. Coating speed was 5 feet/min. The fabric was then dipcoated with a 1.45 specific gravity aqueous dispersion of PTFE to which was added 5% based on PTFE solids of 3-aminopropyltriethoxysilane. The PTFE aqueous dispersion was coated using two sets of smooth bars to apply the dispersion. Oven temperatures were as follows: 121° C., 204° C., and 391° C. Coating speed was 3 feet/min. The fabric was then coated repeatedly using a multiple pass process with a ceramic filled aqueous PTFE dispersion. The ceramic dispersion contained titanium dioxide, PTFE, 3-aminopropyltriethoxysilane, a ceramic dispersing agent, a non-ionic surfactant, a strong organic acid, and a perfluorinated poly(tetrafluoroethylene-alkylvinylether) copolymer. Coating speed varied from 4–8 feet/min. Oven temperatures were 93° C., 204° C., and 399–407° C. Coating speeds were from 3–8 feet/min. The 7628–508 style fiberglass was coated to a final weight of 0.95 lbs/yd$^2$ to yield a smooth sheet. The sheet was obtained on a roll and was treated with a sodium ammonia etching compound to activate the surfaces.

Example 2

Preparation of an Epoxy Coated, Fluoropolymer Impregnated Woven Glass Fabric

An epoxy formulation was prepared by blending a catalyst composition with an epoxy resin formulation. The catalyst composition was prepared by mixing 1.98 kg of methylether ketone solvent, 0.184 kg of a non-ionic surfactant (Pluronic L92 available from the BASF Corporation), and 0.0369 kg of manganese 2-ethylhexanoate (available from OMG Americas). The epoxy formulation was prepared by blending the following: 40.147 kg of Dow 538-A80 (a glycidyl ether of brominated bisphenol A available from the Dow Chemical Company), 38.87 kg of BT2110 (a bismaleimide/bisphenol A dicyanate oligomer available from the Mitsubishi Gas Chemical), 13.9337 kg of DER560 (a brominated epoxy resin available from the Dow Chemical Company), 5.379 kg of Shell Epon 55-BH-30 (a bisphenol A based epoxy available from the Shell Oil Company), 12.16 kg of dimethylformamide solvent, 9.0 kg of methylether ketone, 9.0 kg of propylene glycol methyl ether acetate, and 5.7 kg of Phenoxy PKHS-40 (a poly (hydroxyether) available from Inchem Corp). Prior to use, 136 kg of the epoxy formulation was mixed with 2.20 kg of the catalyst solution.

The thermosetting resin solution was coated onto both sides of the fluoropolymer coated 7628 fabric using a Litztler dual reverse roll coater. The thermoset was applied using a 13 mil gap between the two reverse rolls. The Litzler had two oven sections. Zone 1 was 90° C. while Zone 2 was 165° C. The Litzler is a vertical treater with one 7.5 meter length zone extending vertically connected to another 7.5 meter zone that returns to the base of the treater. The thermoset was coated at 2.5 meters/minutes resulting in a 3 minute dwell time in each of the high and low temperature ovens. The dried prepreg had a final 10 mil thickness, 9 mil from the base fluoropolymer coated fabric, and 0.5 mil per side of the thermosetting resin.

3 plies of the prepreg were stacked up and pressed at 176.6° C. for 10 minutes at 300 psi. The prepreg was weighed before and after pressing. The resin that squeezed out of the press was collected and weighed. 3.5% resin flowout was obtained.

Two plies of the material were sandwiched between 2 pieces of 1 oz. zinc free foil and pressed between skived PTFE sheets that were used for release purposes. The press conditions were 176.6C for 2 hours at 300 psi. The copper cladding was etched off and the samples were dried. The following electrical properties were obtained: dielectric constant was 3.50 (IPC-TM 650 2.5.5,1 MHz), dielectric loss of 0.0047 (IPC-TM 650 2.5.5, 1 MHz), dielectric constant at 10 GHz of 3.41 (IPC TM 650 2.5.5.5), dielectric loss at 10 GHz of 0.0055 (IPC TM 650 2.5.5.5). Peel strength was 13.6 lbs/linear inch (IPC-TM 650 2.4.8). Moisture absorption was 0.28% after 24 hour immersion. Moisture absorption after 1 hour of pressure cooker exposure was 0.84%. This example demonstrates that very attractive electrical properties can be obtained even in the absence of a ceramic filler that might be added to the thermosetting resin to offset the less desirable loss tangent properties of the thermosetting resin itself.

Example 3

Preparation of a Hybrid 4 Layer Multilayer Circuit Board Using the Bond Ply from Example 2

The inner layers of (1) a 21 mil PTFE coated fiberglass laminate clad on both sides with 0.5 oz copper and (2) a 48 mil FR-4 epoxy laminate clad on both sides with 0.5 oz copper were patterned and etched according to the following (subtractive process) standard printed circuit board procedures: punch, holes drilled, hole deburr, scrub & coat inner layers with photoimaging material, expose inner layers, develop inner layers, and strip inner layers. The inner layers of the FR-4 and PTFE fiberglass were then treated with metal oxide, baked, and laminated together using the multilayer bond ply prepreg from Example 2. Press conditions were 176° C. for 2 hours at 300 psi. The 4 layer multilayer was then treated with the following standard outer layer print and etch processes: drilled, deburred, baked, treated for etchback, sodium napthalene etch, electroless plated, photomaterial lamination, expose outer layers, develop outer layers, pattern plate copper and then tin, resist strip, and etch outer layers. A second imaging step was done as follows: bake dry film and apply, coat outer layers, expose outer layers, develop outer layers, tin/lead strip, strip resist, bake before reflow, solder reflow, coat liquid photoimageable solder mask, expose solder mask, develop solder mask, and UV cure solder mask.

Figure 2:
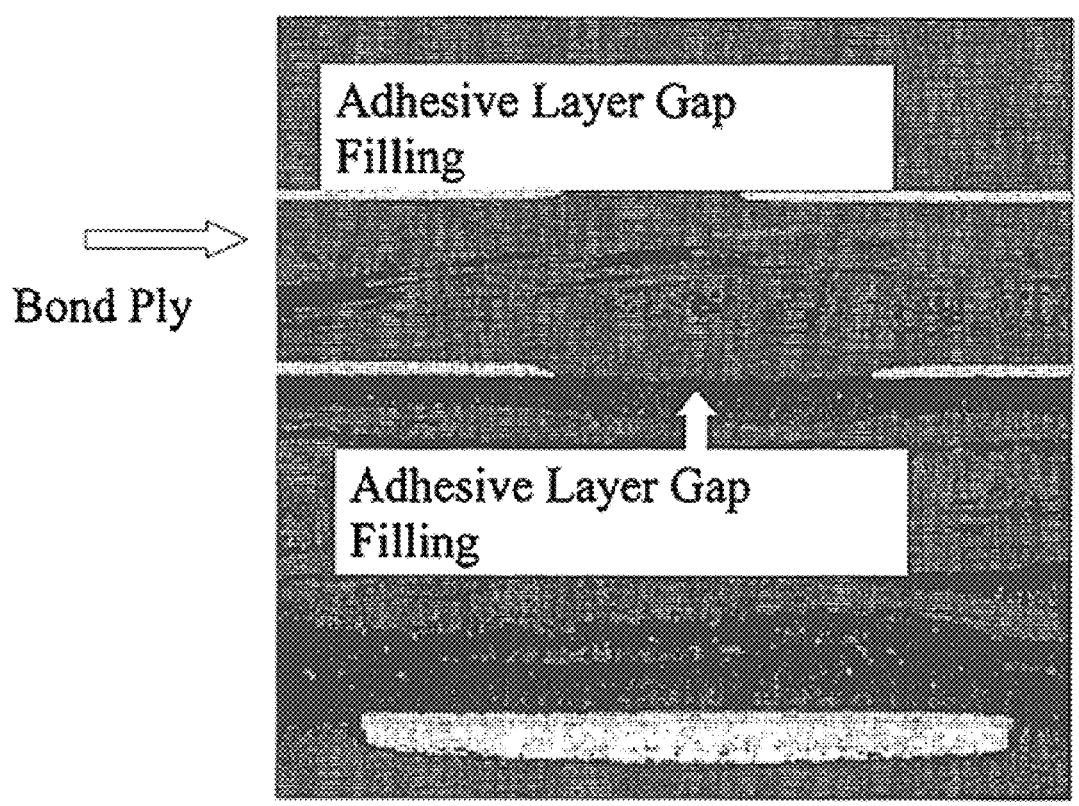
FIG. 2. A four Layer Hybrid Printed Circuit Board Manufactured using a Low Loss Bonding Prepreg comprising PTFE, 7628 Style Fiberglass, and a Thermosetting Resin.
Figure 3:
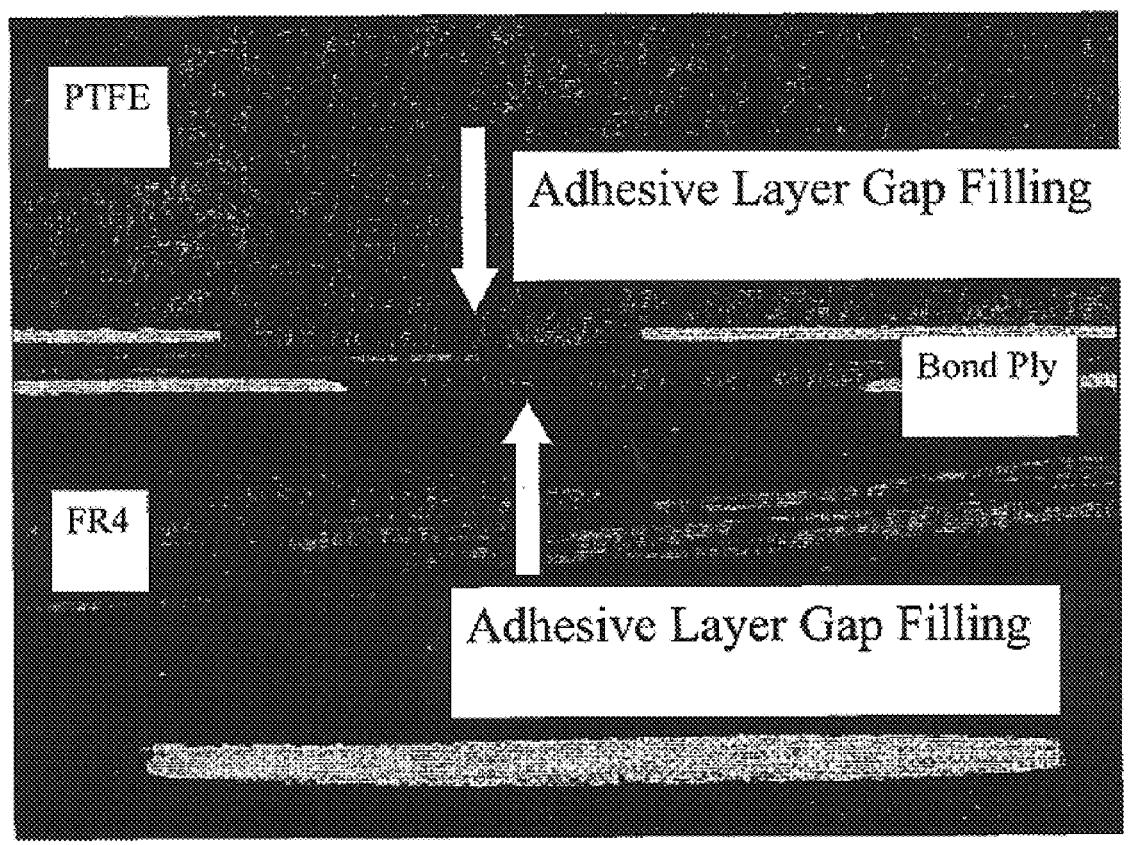
FIG. 3, A four Layer Hybrid Printed Circuit Board Manufactured using a Low Loss Substrate Comprising PTFE, 106 Style Fiberglass, and a Thermosetting Resin.

Examples of the gap filling ability of the multilayer prepreg bond ply from Example 2 can be found in FIGS. 2 and 3. FIGS. 2 and 3 confirm the desired gap filling properties of the bond ply. Microsectioning of the hybrid board did not reveal the presence of any voids between the copper circuitry. This example demonstrates that multilayer hybrid boards can be prepared at conventional thermosetting resin conditions using a fluoropolymer-fiberglass-epoxy resin composite B-staged bond ply as the adhesive layer.

Example 4

Preparation of a Hybrid 4 Layer Multilayer Circuit Board Using a 106 Style Fiberglass Composite Bond Ply Examples 1 and 2 were repeated with the exception that the base PTFE composite was a PTFE coated 106 style woven fiberglass that was coated in a multi pass process to a 60% PTFE content based on the total composite (1.45 mil thickness). The material was then etched using a sodium ammonia etching process. Thermosetting resin was applied to both sides using the previously described procedures. The gap between the reverse rolls was 10 mil that yielded a product having a thickness of approximately 2.5 mils. A 4 layer multilayer was made using the procedure described in Example 3. The gap filling properties of the bond ply are shown in FIG. 3. FIG. 3 confirms the desired gap filling of the bond ply. This example also demonstrates that the invention disclosed herein is applicable to very thin substrates.

Example 5

Preparation of a Fluoropolymer Impregnated Woven Fiberglass Composite Using a Talc Filled Epoxy as the Bonding Layer Example 2 was repeated except that 86.5 kg of talc (Benwood talc available from Zeinex Fabi Benwood, LLC) is dispersed into the thermosetting resin formulation to reduce the impact of the thermosetting resin on the dielectric loss properties of the final laminate. The talc filled thermosetting resin solution is coated onto the 7628 style fiberglass using the previously described coating method. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties.

Example 6

Preparation of a Fluoropolymer Coated Non-Woven Glass Fabric 1.5 mil non-woven polyaramide fabric (Thermount, available from Dupont) made from pulped and/or staple Kevlar or Nomex fibers is coated under low tension according to Example 1 to a 70% PTFE resin content using a PTFE aqueous dispersion. The surface of the composite is sodium naphthalene etched and coated with thermosetting resin according to the process described in Example 2. A 4 layer multilayer is prepared using the procedure outlined in Example 3. This examples demonstrates that a bond ply can be prepared from a non-woven substrate that is suitable for high density interconnect packages such as: multichip modules, ball grid array packages, direct chip attach, and ultra fine lines and spaces. This example further demonstrates that a substrate can be produced that is well suited for laser drilling.

Example 7

Preparation of a Fluoropolymer Impregnated Non-Woven Glass Fabric Surface Coated with a Kaolin Filed Thermosetting Resin Example 6 is repeated with the exception that the thermosetting resin contains a ceramic filler, kaolin. This example demonstrates that a ceramic filler can be used to reduce cost; x, y, and z coefficients of thermal expansion; and dielectric loss properties in high layer count multilayers and packages incorporating fine lines and spaces (multichip modules, ball grid array packages, and direct chip attach).

Example 8

Preparation of a Bond Ply Using a Fiberglass Composite Prepared Using a Hot Roll Laminator Example 4 is repeated with the exception that the 106 style fiberglass is not fully impregnated with a PTFE dispersion. Two separate 1.0 mil skived PTFE films are pressed onto the two sides of a lightly PTFE coated 106 style fiberglass using a hot roll laminator operating at 375C. A thermosetting resin is applied according to the previously described procedures and a 4 layer multilayer PWB is prepared. This example demonstrates that a more cost effective method can be used to apply the PTFE component to the reinforcing component of the bond ply.

Example 9

Preparation of a Ceramic Filled Bond Ply Using a Fiberglass Composite Prepared From a Hot Roll Laminator Example 8 is repeated with the exception that the skived PTFE contains a ceramic filler. This example demonstrates that a ceramic filled PTFE film can be laminated onto a lightly coated fiberglass to increase key properties in a cost efficient manner.

Example 10
Preparation of a Bond Ply Using a Non-woven Reinforcement Prepared Using a Hot Roll Laminator Example 8 is repeated with the exception that a 1.5 mil film of poly(perfluorinated alkylvinylether-tetrafluoroethylene copolymer) is hot roll laminated into a non-woven polyaramide fabric creating a flat substrate. The bond ply is manufactured by sodium napthalene etching the sheet followed by application of the thermosetting resin as previously described. The 4 layer multilayer is prepared using the previously described procedures. This example demonstrates that a non-woven reinforced fluoropolymer composite can be prepared in a cost efficient manner by impregnating a nonwoven fabric with a melt flowable fluorinated polymeric film using a hot roll laminator.

Example 11
Preparation of a Bond Ply Using a Non-woven Reinforcement

PBO staple and pulped fiber is added to a PTFE dispersion. The filled dispersion is then dipcoated in a multipass process onto a 5 mil polyimide carrier film using the temperature conditions outlined in Example 1. The PTFE coated non-woven substrate is then calendered to form a 2 mil flat sheet at 371° C. using a flame-heated hollow cylinder. The sheet is then consolidated from the polyimide carrier film. The sheet is then surface treated using a sodium naphthalene etching solution. The flat sheet is then surface coated with the thermosetting resin composition from Example 2. A 4 layer multilayer is built according to the procedure of Example 3. This example demonstrates that a laser drillable substrate containing PTFE can be prepared from a fiber filled PTFE dispersion yielding a thin low loss composite having controlled x, y, and z coefficient of thermal expansion values.

Example 12
Preparation of a Fluoropolymer Coated Non-Woven Fiber Glass Fabric Non-woven fiberglass, 0.007" and 0.015" thick respectively, (available from Lydal Manning as Manninglas® styles 1201 and 1200 respectively) was coated under low tension according to Example 1 to an 83 to 86% PTFE resin (available from I.E. DuPont) content using a 1.400 specific gravity PTFE aqueous dispersion at 1 to 8 fpm using a smooth metering rod. A subsequent topcoat of PFA dispersion was coated onto the substrate using a 1.400 specific gravity at 3–5 fpm to a finished resin content of 88–91%. The surface of the composite is sodium naphthalene etched and coated with thermosetting resin according to the process described in Example 2. A 4 layer multilayer is prepared using the procedure outlined in Example 3. These examples demonstrate that a bond ply can be prepared from a non-woven substrate. That substrate has ample "good" electrical resin added in much fewer manufacturing steps. The non woven reinforcement is not a fiberglass matrix, therefore no glass fiber window "voids" from the weaving process exist which makes a woven product less homogeneous. This provides for a more uniform product that is suitable for high density interconnect packages such as: multichip modules, ball grid array packages, direct chip attach, and ultra fine lines and spaces. This example further demonstrates that a substrate can be produced that is well suited for laser drilling.

Example 13
Preparation of a Fluoropolymer Impregnated Non-Woven Fiber Glass Composite Using a Talc Filled Epoxy as the Bonding Layer Example 12 is repeated except that the thermosetting resin of Example 5 is used to coat the non-woven substrate. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties. This example further demonstrates that a substrate can be produced that is well suited for laser drilling.

Example 14
Preparation of a Ceramic Filled Fluoropolymer Coated Non-Woven Fiber Glass Fabric Non-woven fiberglass, 0.007" and 0.015" thick respectively, (available from Lydal Manning as Manninglas styles 1201 and 1200 respectively) were coated under low tension according to Example 1. A 25 wt % loading of $TiO_2$ [Available from SCM. TIONA® RCS-9 rutile TiO2 slurry and 25 wt % of $SiO_2$ [available from ITC-$SiO_2$ with 0.5% A-187 fluorosurfactant as a surface treatment] was used by weight in a PFA [perfluorinated alkylvinylether] (available from I. E. DuPont) aqueous dispersion. The ceramic filled dispersion was broken down with water to 1.400 specific gravity and coated from 0.5–2 fpm to achieve a total resin content of 80 to 90%. No top coating and the abundance of ceramic obviate the need for the etching process before the application of the thermosetting bonding layer. A 4 layer multilayer is prepared using the procedure outlined in Example 3. This example demonstrates that a bond ply can be prepared from a non-woven substrate that is suitable for high density interconnect packages such as: multichip modules, ball grid array packages, direct chip attach, and ultra fine lines and spaces. This example further demonstrates that a substrate can be produced that is well suited for laser drilling. This example further demonstrates that with highly filled ceramic composites the chemical etching process is not always required.

Example 15
Preparation of a Ceramic Filled Fluoropolymer Impregnated Non-Woven Fiberglass Composite Using a Talc Filled Epoxy as the Bonding Layer Example 14 is repeated except that the thermosetting resin of Example 5 is used to coat the non-woven base ply. The talc filled bond ply is used as described in Example 3 to make a 4 layer multilayer. The example demonstrates that ceramics can be incorporated into the thermosetting resin layer to reduce cost; x, y, and z coefficients of thermal expansion; and dielectric loss properties. This example further demonstrates that a substrate can be produced that is well suited for laser drilling.

Example 16
Preparation of a Laminate Consisting of Alternating Layers of Low Loss Substrate and Bonding Plies (Low Loss Substrate with Adhesive Layer).

1080 fiberglass was coated as in Example 1 with first a based coat of pure PTFE aqueous dispersion, followed by a series of PTFE dispersions containing ceramic additives. The surface of the PTFE-fiberglass was treated as described in prior sections. The fiberglass was coated to a weight of 0.5 $lbs/yd^2$. A similar thermosetting resin as described in Example 2 was coated onto both sides of the fabric yielding a bonding ply as described in FIG. 1. The thermosetting resin contained fused silica. The bond ply was coated with the thermosetting resin using two opposing wrapped wire metering rods to a weight of 0.6 lbs/yd². This bond ply was combined with a PTFE coated fiberglass that contained no thermosetting resin. 2116 style fiberglass having a base weight of 0.191 lbs/yd² was sequentially coated to a weight of 0.6 lbs/yd² with PTFE. This PTFE-fiberglass substrate was surface treated using the techniques described above. The following laminate was constructed: copper/thermoset treated PTFE-fiberglass/surface treated PTFE-fiberglass/ thermoset treated PTFE-fiberglass/surface treated fiberglass/ thermoset treated PTFE-fiberglass/copper. The laminate was pressed at 900 psi at 392° F. using a 10° F. rate of rise and a 2-hour hold cycle at temperature. The product had a dielectric constant of 2.94 at 10 GHz and a dissipation factor of 0.0034 at 10 GHz. A separate laminate was built using 5 layers of the thermoset treated PTFE-fiberglass of this example. This laminate had a dielectric constant of 3.28 and a dissipation factor of 0.004 at 10 GHz, both of which were flat over frequency. This example demonstrates that when surface treated PTFE-fiberglass is interleafed with thermoset treated PTFE-fiberglass the following can be accomplished (1) the dielectric constant can be further reduced (2) the dissipation factor can be further reduced and (3) the cost can be reduced because there is a reduction in the amount of PTFE-fiberglass that needs to be treated with an adhesive layer.

Example 17
Preparation of a Laminate Consisting of Alternating Layers of Low Loss Substrate and Bonding Plies (Low Loss Substrate with Adhesive Layer).

The experiment of Example 16 was repeated with the exception that a fluoropolymer film, PTFE, was interleafed with layers of PTFE-fiberglass-thermosetting resin. The construction was a follows: copper cladding, thermoset treated PTFE-fiberglass, surface treated 20 mil layer of skived film, thermoset treated PTFE-fiberglass, copper cladding. This example demonstrates that pure fluoropolymer can be inserted into the laminate to reduce dielectric constant, dissipation factor, and cost.

Example 18
Preparation of a Laminate Consisting of Alternating Layers of Reinforcement and Bonding Plies (Low Loss Substrate with Adhesive Layer)

The experiment of Example 16 was repeated with the exception that a layer of 7628 based FR-4 prepreg, 0.008", was intermixed with the 0.006" PTFE-fiberglass-thermosetting adhesive. The construction was a follows: copper cladding, thermoset treated PTFE-fiberglass, FR-4 prepreg, thermoset treated PTFE-fiberglass, copper cladding. This example demonstrates that the cost of the laminate can be significantly reduced by interleafing plies of FR-4 or some other reinforcement or thermoset impregnated reinforcement.

Example 19
Preparation of a Laminate Containing an Injection Moldable Grade of Fluoropolymer in the First Impregnation of the Reinforcement This example was carried out in a similar fashion to Example 1 with the exceptions 1080 fiberglass was used that the first pass coating of the fluoropolymer comprised a fluoropolymer dispersion of MFA or PFA, copolymers of tetrafluoroethylene and either of perfluorinated propyl vinyl ether or perfluorinated methyl vinylether, and 3-aminopropyltriethoxysilane. The 3-aminopropyltriethoxysilane was present in a 5 phr based on the solids weights of the silane and the fluoropolymer. This example demonstrates that an injection moldable grade of fluoropolymer can be used in the first fluoropolymer dispersion pass.

Example 20
Preparation of a Laminate Containing a PTFE Particle that has been Crosslinked This example was carried out in a similar fashion to Example 1 with the exception that either solid particles of crosslinked PTFE or similar particles dispersed in an aqueous emulsion were added to the fluoropolymer dispersions. This example demonstrates that a reduced coefficient of thermal expansion can be obtained by adding crosslinked fluoropolymer particles to non crosslinked fluoropolymers.

Example 21
Preparation of a Laminate Containing a Crosslinked PTFE Particle that has been Incorporated into the Thermosetting Adhesive Component This example was carried out in a similar fashion to Example 5 with the exception that either solid particles of crosslinked PTFE or similar particles dispersed in some medium emulsion were added to the thermosetting adhesive. This example demonstrates that a reduced dissipation factor can be obtained by adding crosslinked fluoropolymer particles to the thermosetting adhesive.

Example 22
Preparation of a Laminate Containing a Plurality of Ceramics in the PTFE-fiberglass Layer and a Ceramic in the Adhesive Layer.

Examples 1, 2, and 3 are repeated with the exceptions that the $2^{nd}$ pass and subsequent coating of the fluoropolymer onto the woven fiberglass substrate contained 50 wt % of a ceramic dielectric modifier that comprised amorphous fused silica and titanium dioxide. 1080 style woven fiberglass is coated to 0.14 lbs/yd² with a dispersion of silane and polytetrafluoroethylene. The substrate is then coated to a weight of 0.5 lbs/yd² in multiple passes using a ceramic fluoropolymer dispersion comprising PTFE, amorphous fused silica, and fiberglass. The surface of the substrate is then treated using previously described techniques. The substrate was then coated with a similar thermosetting adhesive composition described in Example 2 with the exception that the adhesive contained>50 wt % of amorphous fused silica. The PTFE-ceramic-fiberglass substrate was coated to a weight of 0.6 lbs/yd². A laminate was produced from this substrate by pressing at 450 psi, 392° F., for two hours after a 10° F./minute ramp rate. This laminate yielded a dissipation factor of 0.004 and a dielectric constant of 3.27.

Figure 10:
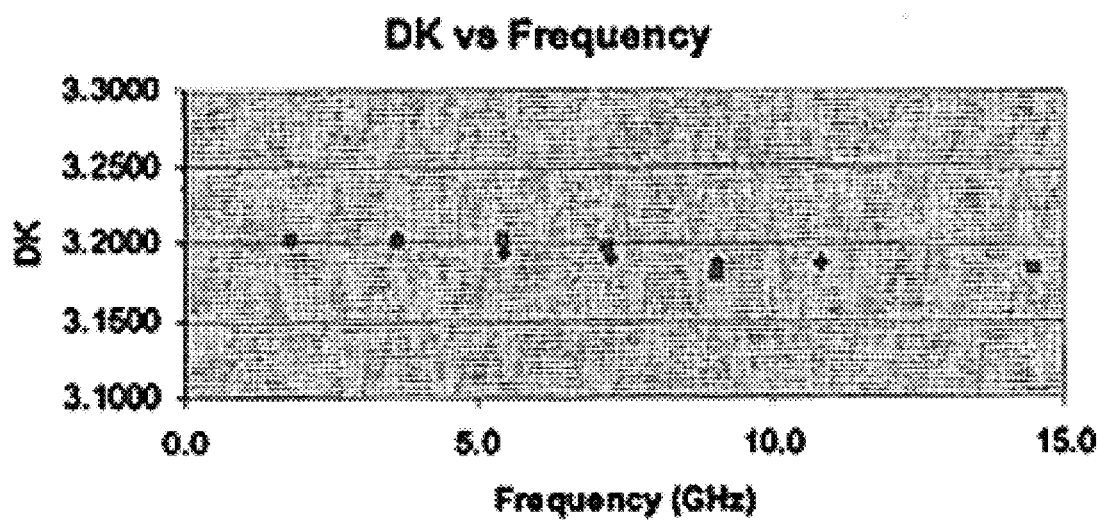
FIG. 10. A low loss substrate comprising a thermosetting adhesive and a fluoropolymer impregnated woven fiberglass, that is used to prepare two separate laminates. Laminates were built from a plurality of low loss substrates comprising a thermosetting adhesive having either a 25 wt % or a 35 wt % component of the thermosetting adhesive.
Figure 10:
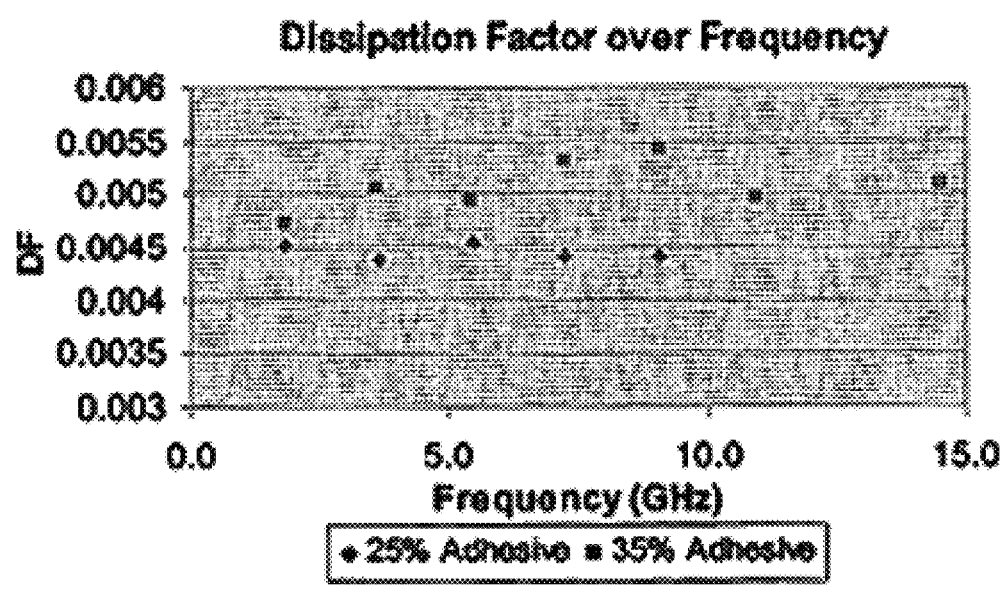

Example 23
Preparation of a Bondply having Varying Levels of Thermosetting Resin 1080 fiberglass was coated in a similar fashion to Examples 1 and 22. The bare weight of 0.088 lbs/yd² was coated to 0.13 lbs/yd² with polytetrafluoroethylene dispersion. The substrate was then coated to 0.3 lbs/yd² with multiple coating passes of a polytetrafluoroethylene dispersion containing 17 wt % (solids on solids) of titanium dioxide. The substrate was then surface treated using the previously described methods. A fused silica modified thermosetting resin similar to Example 2 was applied to the surfaces of the substrate using 0.024" wrapped wire rods, 9.3 ft/min. This thermosetting resin formulation was modified such that chain extended epoxy resins were drastically reduced or completely eliminated and replaced with di glycidyl ether analogues. The weight increased from 1.69 g/16 in$^2$ to 2.25 g/16 in$^2$ yielding a thermoset coated PTFE-fiberglass substrate having a thermoset content of ≈25%. The same PTFE-fiberglass substrate was coated to a 2.6 g/16 in$^2$ weight using 0.032" wrapped wire rods yielding a thermosetting resin content of 35 wt %. Laminates were prepared from the respective bondplies by stacking a multitude of layers together and laminating at 392° F. for one hour using a 10° F. rate of temperature rise. The dependence of the dissipation factor and dielectric constant on frequency can be seen in FIG. 10. This example demonstrates that either a laminate or bondply can be designed with the desired dissipation factor less than 0.005. This example also demonstrates that that if the thermosetting adhesive layer is allowed to increase beyond the 35 wt % content, it is more difficult to maintain a dissipation factor less than 0.005. This example also demonstrates the impact of the fused silica modifier to the thermosetting layer. Fused silica has a dissipation factor of 0.0045 versus 0.017 for typical epoxy based thermosets. If the same laminate did not comprise fused silica in the thermosetting adhesive layer, a dissipation factor less than 0.005 could not be achieved.

Example 24
Preparation of a High Flowing Conformal Low Loss Substrate Bonding Ply A 3 mil PTFE-fiberglass substrate was prepared using previously described methods by coating standard 1080 fiberglass with first a PTFE dispersion and subsequently ceramic filled aqueous dispersions to a weight of 0.28 lbs/yd$^2$. This was surface treated using previously described techniques. A high flowing thermosetting resin was applied using previously described methods. The high flowing thermosetting resin solution consisted of 204 lbs of amorphous fused silica, 85.4 lbs BT2110 resin, 53.3 lbs Epon Resin 826 (a non advanced diglycidylether derivative of bisphenol A), 13.4 lbs DER560 (a brominated diglycidylether derivative of bisphenol A, a minor portion of Dow538-A80 brominated resin (15.79 lbs), 50 lbs of a solvent (propylene glycolmethyletheracetate), catalyst (manganese octanoate), and a UV active agent (Uvitex OB). The solution viscosity before treating was adjusted to 1.280 using propylene glycolmethyletheracetate. The PTFE-fiberglass substrate was coated taaao 0.36 lbs/yd$^2$ with the thermosetting resin using a two zone treater with temperatures of 240° F. and 280° F., at a speed of 9.3 ft/min. The thermosetting resin was applied with wrapped wire wound rods. This substrate was then used as a bonding prepreg to make multilayers shown in FIG. 11. The FR-4 inner layers were based on 1 oz copper. Lamination was conducted at 392° F., using a 10° F./minute rate of heat rise. FIG. 11 demonstrates that the PTFE-fiberglass layer when combined with a very high flowing thermosetting resin system, the PTFE-fiberglass layer can be reformed during lamination and can conform to the outlines of copper circuitry thus reducing the minimum amount of thermosetting resin necessary to fill difficult circuitry.

It is unexpected that the PTFE-fiberglass layer will participate in the gap filling of the circuitry in addition to the high flowing thermosetting resin system.

What is claimed is:

1. A low loss circuit board bonding ply having a dissipation factor of less than 0.005 and a dielectric constant of less than 4.0, said low loss circuit board bonding ply comprising 0.025 to 0.2 lbs/yd$^2$ of a high flowing thermosetting adhesive composition disposed on a fluoropolymer composite comprising a first fluoropolymer composition comprising a ceramic dielectric modifier and disposed on a substrate selected from nonwoven fabrics, polymeric films and woven fabrics, said woven fabrics being precoated with a filler-free second fluoropolymer composition.

2. A low loss circuit board bonding ply according to claim 1, wherein the first fluoropolymer composition comprises a plurality of sublayers comprising ceramic dielectric modifier distributed in the fluoropolymer.

3. A low loss circuit board bonding ply according to claim 1, wherein the high flowing thermosetting adhesive composition has a precure melt viscosity of less than 100 Pa*s over a temperature range of 20° C. to 200° C.

4. A low loss circuit board bonding ply according to claim 1, wherein the high flowing thermosetting adhesive composition comprises an epoxy resin.

5. A low loss circuit board bonding ply according to claim 4, wherein the high flowing thermosetting adhesive composition additionally comprises an epoxy-functional reactive diluent.

6. A low loss circuit board bonding ply according to claim 1, wherein the first and second fluoropolymer compositions comprise PTFE.

7. A low loss circuit board bonding ply according to claim 1, wherein the ceramic dielectric modifier comprises silica.

8. A loss circuit board bonding ply according to claim 1, wherein the fluoropolymer composition additionally comprises a filler other than the ceramic dielectric modifier.

9. A low loss circuit board bonding ply according to claim 8, wherein the filler comprises a crosslinked PTFE filler.

10. A low loss circuit board bonding ply according to claim 1, wherein the substrate comprises a woven fabric.

11. A low loss circuit board bonding ply according to claim 1, wherein the substrate comprises a woven fiberglass fabric.

12. A low loss circuit board bonding ply according to claim 1, wherein the fluoropolymer composite is perforated by laser or mechanical means before the adhesive layer is applied.

13. A low loss circuit board bonding ply according to claim 1, wherein a surface of the fluoropolymer composite is treated to enhance adhesion before the adhesive layer is applied.

14. A low loss circuit board bonding ply according to claim 1, wherein the substrate comprises a non woven fabric.

15. A low loss circuit board bonding ply according to claim 1, wherein the substrate comprises fiberglass or polymeric fibers.

16. A low loss laminate comprising at least one low loss circuit board bonding ply according to claim 1.

17. A low loss laminate according to claim 16, additionally comprising a non-adhesive layer bonded to the low loss circuit board bonding ply.

18. A low loss laminate according to claim 17, wherein the non-adhesive layer is sandwiched between at least two of said low loss circuit board bonding plies.

19. A low loss laminate according to claim 17, wherein the non-adhesive layer is selected from a fluoropolymer film, a fluoropolymer composite comprising a fiberglass substrate coated with a fluoropolymer, and a porous substrate.

20. A low loss laminate according to claim 17, wherein the non-adhesive layer comprises an expanded porous PTFE.

21. A low loss laminate according to claim 17, wherein the non-adhesive layer comprises a porous partially impregnated non woven fabric.

22. A low loss laminate according to claim 17, wherein the non-adhesive layer comprises a porous partially impregnated non woven fiberglass fabric.

23. A low loss laminate according to claim 16, wherein the non-adhesive layer is selected from a fluoropolymer film and a fluoropolymer composite comprising a fiberglass substrate coated with a fluoropolymer.

24. A low loss laminate according to claim 16, wherein the non-adhesive layer comprises a fiberglass substrate coated with a fluoropolymer.

25. A low loss laminate according to claim 16, wherein the non-adhesive layer comprises a fluoropolymer film.

26. A low loss laminate according to claim 16, wherein the non-adhesive layer comprises a thermoset impregnated fiberglass.

27. A low loss laminate according to claim 26, wherein the thermoset is selected from the group consisting of resins, elastomers, polyesters, anhydrides, bismaleimides, triazine and cyanate esters.

28. A low loss laminate according to claim 16, where the non-adhesive layer additionally comprises a reinforcement.

29. A low loss laminate according to claim 16, additionally comprising at least one metallization layer.

30. A process for fabricating a low loss multilayer printed circuit board comprising: providing at least one low loss circuit board bonding ply according to claim 1; and laminating together a plurality of printed circuit board layers with said at least one low loss circuit board bonding ply.

* * * * *